(12) United States Patent
Cho et al.

(10) Patent No.: US 12,369,452 B2
(45) Date of Patent: Jul. 22, 2025

(54) DISPLAY MODULE AND MANUFACTURING METHOD OF THE SAME

(71) Applicant: Samsung Display Co., Ltd., Yongin-si (KR)

(72) Inventors: Yunjeong Cho, Cheonan-si (KR); Daewoo Lee, Sejong-si (KR); Kyunghoon Chae, Asan-si (KR); Hyeon Deuk Hwang, Cheonan-si (KR); Dohyung Ryu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 472 days.

(21) Appl. No.: 17/746,430

(22) Filed: May 17, 2022

(65) Prior Publication Data
US 2023/0071510 A1    Mar. 9, 2023

(30) Foreign Application Priority Data
Aug. 25, 2021    (KR) .......................... 10-2021-0112666

(51) Int. Cl.
*H10K 50/844* (2023.01)
*H10K 59/131* (2023.01)
(Continued)

(52) U.S. Cl.
CPC ......... *H10K 50/844* (2023.02); *H10K 59/131* (2023.02); *H10K 71/00* (2023.02); *H10K 59/1201* (2023.02); *H10K 2102/311* (2023.02)

(58) Field of Classification Search
CPC .... H10K 50/844; H10K 59/131; H10K 71/00; H10K 59/1201; H10K 2102/311;
(Continued)

(56) References Cited

U.S. PATENT DOCUMENTS 9,379,355 B1 *  6/2016  Lee ........................... B32B 5/18
10,224,498 B2   3/2019  Um et al.
(Continued)

FOREIGN PATENT DOCUMENTS

KR    10-2018-0007720    1/2018
KR    10-2018-0035982    4/2018
(Continued)

*Primary Examiner* — Karen Kusumakar
*Assistant Examiner* — Shawn Shaw Muslim
(74) *Attorney, Agent, or Firm* — KILE PARK REED & HOUTTEMAN PLLC

(57) ABSTRACT

A display module includes a base layer including a first portion including a light emitting device, a second portion including a circuit board electrically connected to the second portion, and a third portion disposed between the first portion and the second portion, the third portion being bent, a light emitting device layer overlapping the first portion in a plan view and disposed on an upper surface of the first portion of the base layer, a protective film disposed on a lower surface of the base layer, the protective film including an opening overlapping the third portion of the base layer in a plan view, and a first protective layer disposed on a lower surface of the third portion and overlapping the opening of the protective film in a plan view, wherein a modulus of the first protective layer is about $10^6$ Pa or higher than about $10^6$ Pa.

20 Claims, 16 Drawing Sheets

(51) Int. Cl.
*H10K 71/00* (2023.01)
*H10K 59/12* (2023.01)
*H10K 102/00* (2023.01)

(58) Field of Classification Search
CPC .... H10K 77/111; H10K 50/84; Y02E 10/549; B32B 3/266; C09D 133/00; C09D 163/00; C09D 175/00; C09D 183/04
See application file for complete search history.

(56) References Cited

U.S. PATENT DOCUMENTS

| | | |
|---|---|---|
| 10,254,799 B2 | 4/2019 | Nishikawa |
| 10,483,098 B2 | 11/2019 | Um et al. |
| 10,569,501 B2 | 2/2020 | Lim et al. |
| 10,680,200 B2 | 6/2020 | Namkung |
| 10,826,003 B2 | 11/2020 | Um et al. |
| 11,017,716 B2 | 5/2021 | Kim |
| 11,152,595 B2 | 10/2021 | Jeon et al. |
| 2018/0128965 A1* | 5/2018 | Ross ..................... B29C 39/006 |
| 2020/0409497 A1 | 12/2020 | Kim et al. |

FOREIGN PATENT DOCUMENTS

| | | |
|---|---|---|
| KR | 10-2019-0087694 | 7/2019 |
| KR | 10-2019-0119244 | 10/2019 |
| KR | 10-2019-0134294 | 12/2019 |
| KR | 10-2021-0004473 | 1/2021 |

\* cited by examiner

DISPLAY MODULE AND MANUFACTURING METHOD OF THE SAME

CROSS-REFERENCE TO RELATED APPLICATION(S)

This application claims priority to and benefits of Korean Patent Application No. 10-2021-0112666 under 35 U.S.C. § 119, filed on Aug. 25, 2021 in the Korean Intellectual Property Office, the entire contents of which are incorporated herein by reference.

BACKGROUND

1. Technical Field

The disclosure herein relates to a display module and a method for manufacturing the display module. For example, the disclosure herein relates to a display module with improved durability and rigidity of a bending portion, and a method for manufacturing the same.

2. Description of the Related Art

In recent years, various display devices are made thin, small, and lightweight. Accordingly, various studies are being conducted for mounting driving elements for displaying an image on a display device in a limited region of the display device.

A display device may be provided in a form in which driving elements for displaying an image are directly mounted on a display panel, or in a form in which a circuit board on which driving elements are mounted is connected to a display panel.

The display panel or the circuit board may be cracked due to a repeated bending action or during a process of being bonded in a bent state, or may be damaged due to a tensile force generated during bending.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display module having improved durability and strength of a bending portion.

The disclosure also provides a bending portion whose defects generated during a manufacturing process are prevented and which has improved strength.

An embodiment provides a display module that may include a base layer including a first portion including a light emitting device, a second portion including a circuit board electrically connected to the second portion, and a third portion disposed between the first portion and the second portion, the third portion being bent; a light emitting device layer overlapping the first portion in a plan view and disposed on an upper surface of the first portion of the base layer; a protective film disposed on a lower surface of the base layer, the protective film including an opening and overlapping the third portion of the base layer in a plan view; and a first protective layer disposed on a lower surface of the third portion and overlapping the opening of the protective film in a plan view, wherein a modulus of the first protective layer is about $10^6$ Pa or higher than about $10^6$ Pa.

In an embodiment, the first protective layer may include at least one of an acrylic resin, an epoxy-based resin, and a silicon-based resin.

In an embodiment, the display module may further include a second protective layer disposed on an upper surface of the third portion of the base layer.

In an embodiment, a method for manufacturing a display module may include providing a base layer including a first portion, a second portion, and a third portion disposed between the first portion and the second portion, the third portion including flexibility; providing a light emitting device on an upper surface of the first portion of the base layer; providing a resin composition on a lower surface of the third portion of the base layer; curing the resin composition by a first method to form a first cured product; and curing the first cured product by a second method different from the first method to form a second cured product, wherein the resin composition may include a first reactant activated by the first method and a second reactant activated by the second method.

In an embodiment, the method may further include bending the third portion of the base layer between the curing of the resin composition and the curing of the first cured product such that the first portion of the base layer and the second portion of the base layer face each other.

In an embodiment, a modulus of the first cured product may be lower than a modulus of the second cured product.

In an embodiment, a modulus of the resin composition may be about $10^3$ Pa or lower than about $10^3$ Pa.

In an embodiment, a modulus of the first cured product may be about $10^4$ Pa or lower than about $10^4$ Pa.

In an embodiment, a modulus of the second cured product may be about $10^6$ Pa or higher than about $10^6$ Pa.

In an embodiment, the method may further include providing signal lines to the first portion, the second portion, and the third portion after the providing of the light emitting device and before the providing of the resin composition, wherein the signal lines may overlap at least a portion of the second cured product in a plan view.

In an embodiment, the method may further include providing a protective film below the base layer before the providing of the resin composition, wherein the protective film may include an opening and overlapping at least a portion of the third cured product in a plan view, and the providing of the resin composition may include providing the resin composition in the opening of the protective film.

In an embodiment, the first method may be UV curing, and the second method may be thermal curing or natural curing.

In an embodiment, the first reactant may include a photoinitiator or a latent catalyst.

In an embodiment, the second reactant may include a thermal initiator, a material containing an isocyanate group, or a silicon-based material.

In an embodiment, the first reactant may include an acrylic monomer, an acrylic oligomer, and an acrylic radical photoinitiator, and the second reactant may include a urethane-based material containing an isocyanate group.

In an embodiment, the first reactant may include an acrylic monomer, an acrylic oligomer, and an acrylic radical photoinitiator, and the second reactant may include an epoxy-based monomer, an epoxy-based oligomer, and an epoxy-based anion thermal initiator.

In an embodiment, the first reactant may include an acrylic monomer, an acrylic oligomer, and an acrylic radical photoinitiator, and the second reactant may include an acrylic monomer, an acrylic oligomer, and an acrylic thermal initiator.

In an embodiment, the first reactant may include an epoxy-based monomer, an epoxy-based oligomer, and an epoxy-based cation photoinitiator, and the second reactant may include an epoxy-based monomer, an epoxy-based oligomer, and an epoxy-based cation thermal initiator.

In an embodiment, the first reactant may include a latent catalyst and an inhibitor, and the second reactant may include a silicon-based monomer and a silicon-based oligomer.

In an embodiment, the method may further include providing a circuit board to the second portion before the providing of the resin composition.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
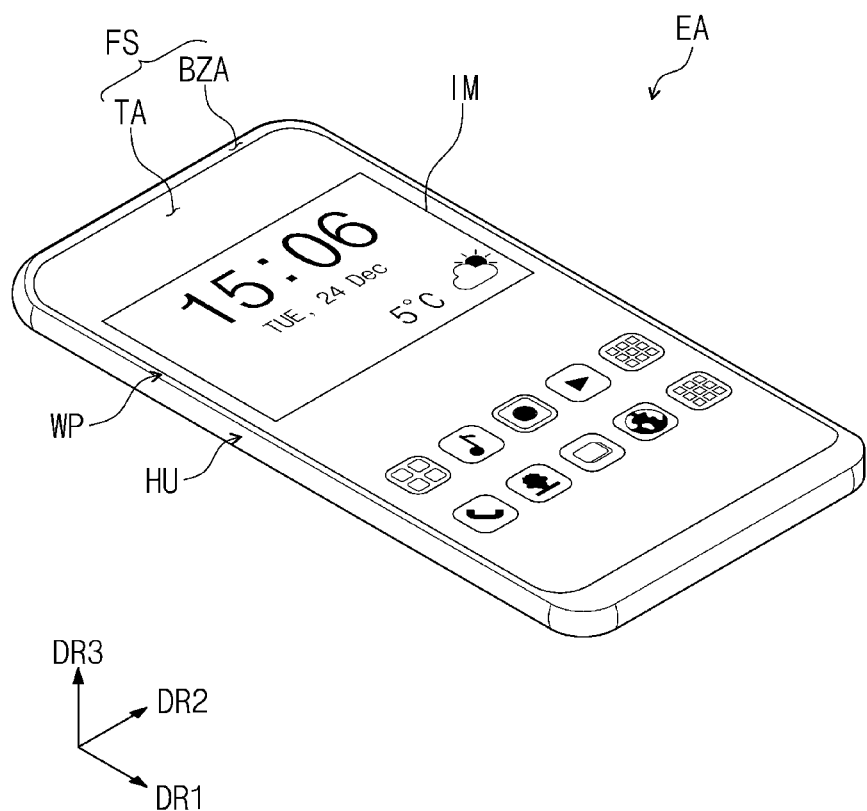
FIG. 1 is a coupling perspective view of a display device according to an embodiment.

Hereinafter, embodiments will be described with reference to the accompanying drawings. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, when an element (or an area, a layer, a portion, etc.) is referred to as being "on," "connected to," or "coupled to" another element, it means that the element may be directly connected to/coupled to the other element, or that a third element may be disposed therebetween.

It will be understood that the terms "connected to" or "coupled to" may include a physical or electrical connection or coupling.

Like reference numerals refer to like elements. Also, in the drawings, the thickness, the ratio, and the dimensions of elements are exaggerated for an effective description of technical contents.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner within the spirit and the scope of the disclosure. The terms of a singular form may include plural forms unless the context clearly indicates otherwise.

In addition, terms such as "below," "lower," "above," "upper," and the like are used to describe the relationship of components shown in the drawings. The terms are used as a relative concept and are described with reference to the direction indicated in the drawings but are not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It should be understood that the terms "comprises," "comprising," "includes," and/or "including,", "has," "have," and/or "having," and variations thereof are intended to specify the presence of stated features, integers, steps, operations, elements, components, or combinations thereof in the disclosure, but do not preclude the presence or addition of one or more other features, integers, steps, operations, elements, components, or combinations thereof.

In the disclosure, when "Component B is directly disposed on Component A," it means that no separate adhesive layer, for example, and adhesive member, for example, is disposed between Component A and Component B.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display module according to an embodiment and a display device including the same will be described with reference to the accompanying drawings.

Figure 2:
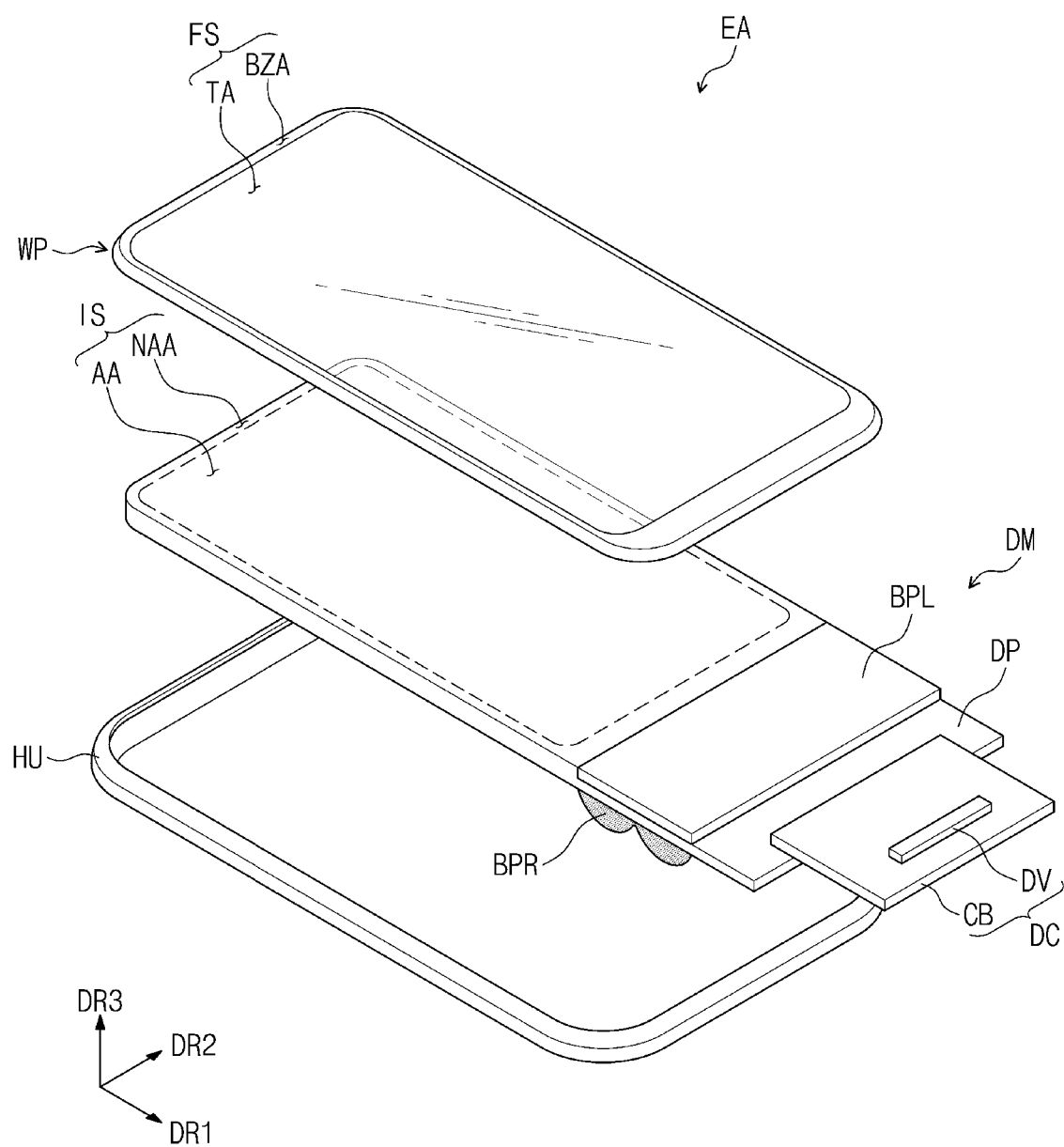
FIG. 2 is an exploded perspective view of a display device according to an embodiment.

FIG. 1 is a coupling perspective view of a display device according to an embodiment. FIG. 2 is an exploded perspective view of a display device according to an embodiment.

Referring to FIG. 1 and FIG. 2, a display device EA may be a device activated by an electrical signal. The display device EA may include various embodiments. For example, the display device EA may be used in large electronic devices such as televisions, monitors, or external advertisement boards, and also in small and medium-sized electronic devices such as personal computers, notebook computers, personal digital terminals, car navigation system units, game machines, portable electronic apparatuses, and cameras. It should be understood that these are examples, and the display device EA may be employed in other electronic devices without departing from the disclosure. In an embodiment, the display device EA is illustrated, for example, as a smart phone.

The display device EA may display an image IM toward a third direction DR3 on a display surface FS parallel to each of a first direction DR1 and a second direction DR2. The image IM may include a moving image as well as a still image. In FIG. 1, as an example of the image IM, a watch window and icons are illustrated. The display surface FS on which the image IM is displayed may correspond to a front surface of the display device EA, and may correspond to a front surface of the window WP.

The display surface FS may be parallel to a plane defined by the first direction DR1 and the second direction DR2. The thickness direction of the display device EA is indicated by the third direction DR3, which is the normal direction of the display surface FS.

In an embodiment, a front surface (or an upper surface) and a back surface (or a lower surface) of each member are defined on the basis of a direction in which the image IM is displayed. The front surface and the back surface oppose each other in the third direction DR3 and the normal direction of each of the front surface and the back surface may be parallel to the third direction DR3. Directions indicated by the first to third directions DR1, DR3, and DR3 are a relative concept, and may be converted to different directions. Hereinafter, directions respectively indicated by the first to third directions DR1, DR3, and DR3 are denoted by the same reference numerals and indicate the same directions. In the disclosure, "in a plan view" may mean when viewed in the third direction DR3.

The display device EA may include a window WP, a display module DM, and a housing HU. In an embodiment, the window WP and the housing HU are bonded to constitute the appearance of the display device EA.

The window WP may include an optically transparent insulation material. For example, the window WP may include glass or plastic. The window WP may have a multi-layered structure or a single-layered structure. For example, the window WP may include plastic films bonded with an adhesive, or a glass substrate and a plastic film bonded with an adhesive.

The display surface FS of the window WP defines the front surface of display device EA as described above. The transmissive region TA may be an optically transparent region. For example, the transmissive region TA may be a region having a visible light transmittance of about 90% or higher.

A bezel region BZA may be a region having a relatively low light transmittance compared to the transmissive region TA. The bezel region BZA defines the shape of the transmissive region TA. The bezel region BZA may be adjacent to the transmissive region TA, and may surround the transmissive region TA.

The bezel region BZA may have a color. The bezel region BZA may cover or overlap a peripheral region NAA of the display module DM to block the peripheral region NAA from being viewed from the outside. This is an illustrated example, and in the window WP according to an embodiment, the bezel region BZA may be omitted.

Although not illustrated in FIG. 1 and FIG. 2, an adhesive layer may be further disposed between the window WP and the display module DM. The adhesive layer may be an organic adhesive layer such as an optically clear adhesive (OCA) film, an optically clear resin (OCR), or a pressure sensitive adhesive (PSA) film. The organic adhesive layer may include a polyurethane-based, polyacrylic, polyester-based, polyepoxy-based, or polyvinyl acetate-based adhesive material. In an embodiment, the adhesive layer may be an optically clear adhesive film.

The display module DM may display the image IM and sense an external input. The external input may include various forms of inputs provided from the outside of the display module DM. An external input applied from the outside may be provided in various forms.

For example, the external input may include not only a contact by a part of a user's body, such as a hand, but also an external input (for example, hovering) applied in close proximity, or adjacent to the display device EA at a distance. Also, the external input may have various forms such as force, pressure, and light, but is not limited to any one embodiment.

The display module DM may include a front surface IS including an active region AA and the peripheral region NAA. The active region AA may be a region activated by an electrical signal.

In an embodiment, the active region AA may be a region in which the image IM is displayed, and at the same time, may be a region in which an external input is sensed. The transmissive region TA overlaps at least the active region AA. For example, the transmissive region TA overlaps a front surface or at least a portion of the active region AA. Accordingly, a user may visually recognize the image IM through the transmissive region TA, or may provide an external input. However, this is an illustrated example. In the active region AA, a region in which the image IM is displayed and a region in which an external input is sensed may be separated from each other, but the embodiment is not limited to any one embodiment.

The peripheral region NAA may be a region covered or overlapped by the bezel region BZA. The peripheral region NAA is adjacent to the active region AA. The peripheral region NAA may surround the active region AA. In the peripheral region NAA, a driving circuit or a driving wire for driving the active region AA may be disposed.

The display module DM may include at least a display panel DP and a circuit board DC. The display module DM may further include an input sensing unit to be described later. The display module DM may include a first protective layer BPR disposed below the display panel DP. The display module DM of an embodiment may further include a second protective layer BPL disposed above the display panel DP. The first protective layer BPR and the second protective layer BPL will be described in detail later.

The display panel DP may be a component which substantially generates the image IM. The image IM generated by the display panel DP is visually recognized by a user from the outside through the transmissive region TA. In an embodiment, the active region AA and the peripheral region NAA of the display module DM may substantially mean the active region AA and the peripheral region NAA of the display panel DP. For example, the display panel DP may include the front surface IS including the active region AA and the peripheral region NAA.

The circuit board DC may be connected to one end or an end of the display panel DP to generate an electrical signal to be provided to the display panel DP or process an electrical signal provided from the display panel DP. The circuit board DC may include a flexible film CB and a driving circuit DV.

The flexible film CB is bonded to the display panel DP. The driving circuit DV may be mounted on the flexible film CB. The driving circuit DV is electrically connected to the flexible film CB through circuit wires (not shown) included in the flexible film CB. The flexible film CB may electrically connect the driving circuit DV and the display panel DP, and the driving circuit DV may generate an electrical signal to be provided to the display panel DP or process an electrical signal provided from the display panel DP.

The housing HU is bonded to the window WP. The housing HU is bonded to the window WP to provide an internal space. The housing HU may include sidewall portions, and the sidewall portions of the housing HU and the window WP may include an internal space. The display module DM may be received in the internal space.

The housing HU may include a material having relatively high rigidity. For example, the housing HU may include glass, plastic, or a metal, or may include frames and/or plates composed of a combination thereof. The housing HU may stably protect components of the display device EA accommodated in an internal space from an external impact.

Figure 3:
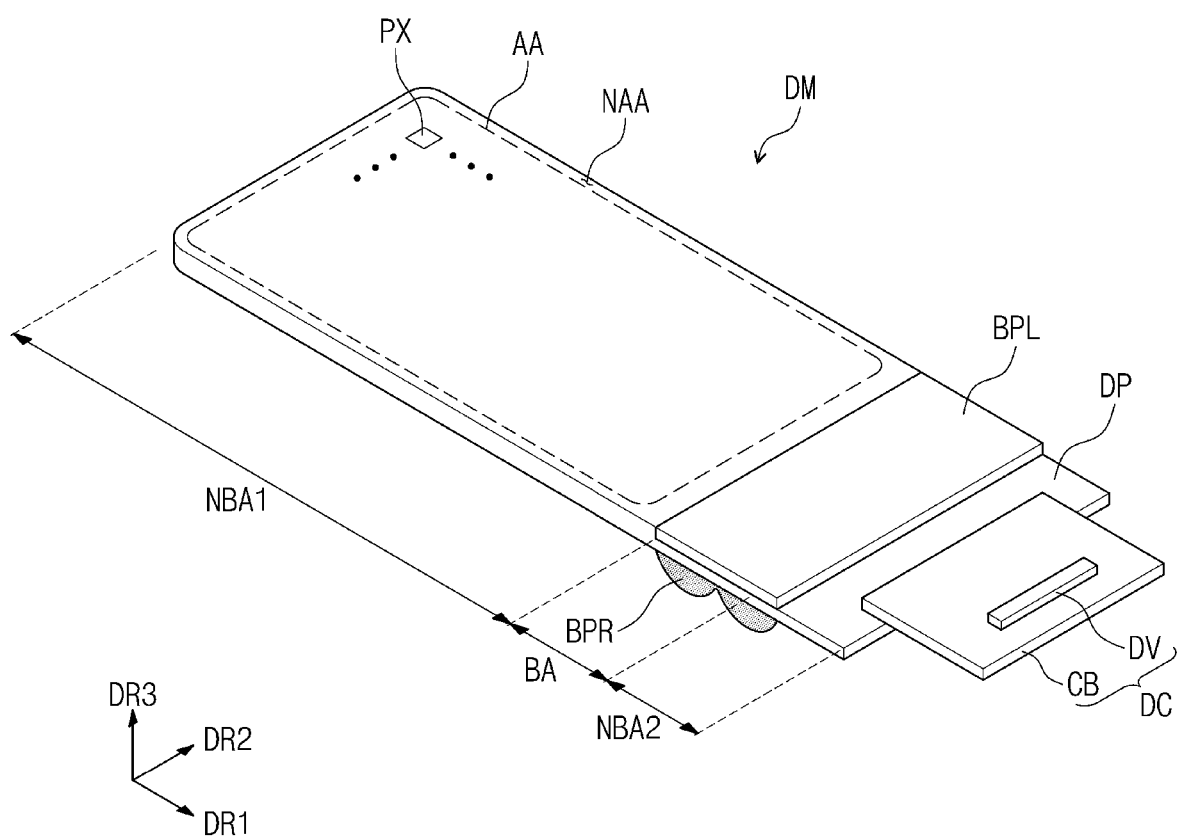
FIG. 3 is a schematic perspective view of a display module according to an embodiment.
Figure 4:
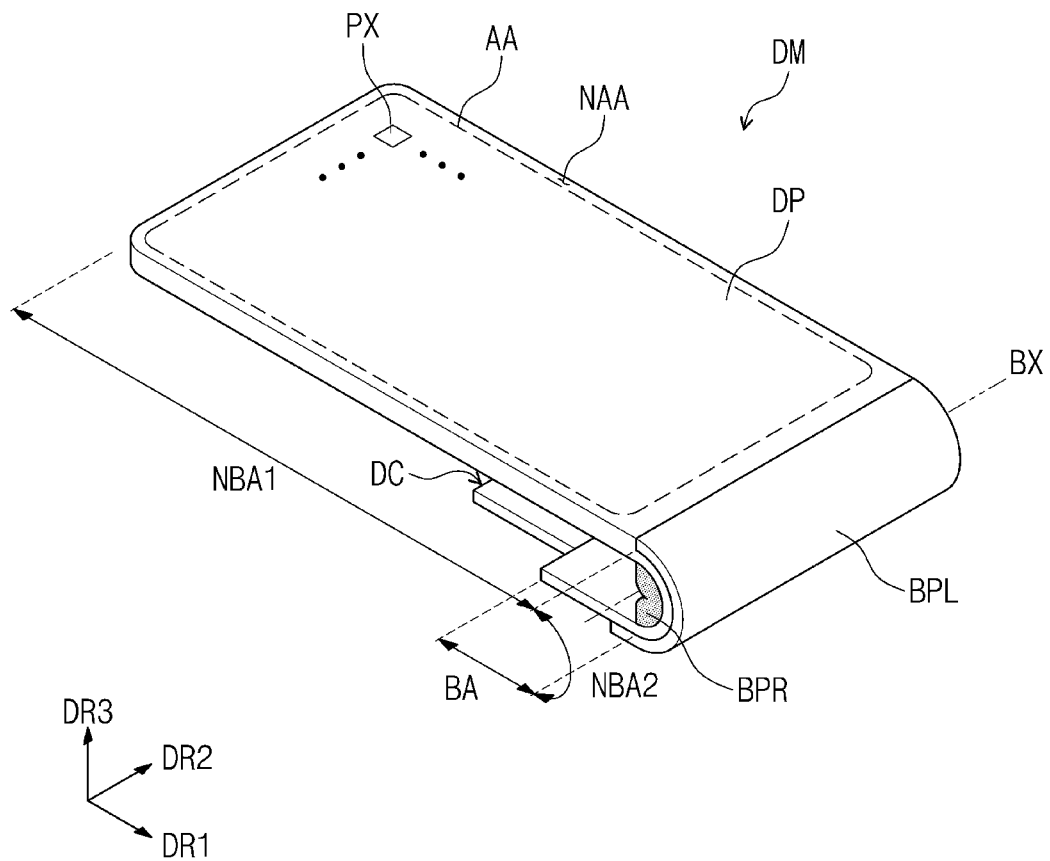
FIG. 4 is a schematic perspective view illustrating that a portion of the display module illustrated in FIG. 3 is bent.

FIG. 3 is a schematic perspective view of a display module according to an embodiment, and FIG. 4 is a schematic perspective view illustrating that a portion of the display module illustrated in FIG. 3 is bent.

Referring to FIG. 3 and FIG. 4, as an example, the display module DM is illustrated as having a rectangular shape or a substantially rectangular shape which has long sides in the first direction DR1 and has short sides in the second direction DR2. However, the disclosure is not limited thereto. The shape of the display module DM is not particularly limited.

The display module DM may include the active region AA and the peripheral region NAA which is adjacent to the active region AA. The active region AA and the peripheral region NAA may respectively correspond to the transmissive region TA (see FIG. 1) and the bezel region BZA (see FIG. 1).

In an embodiment, the active region AA may be defined in a central portion of the display module DM, and the peripheral region NAA may have a shape surrounding the active region AA. However, the embodiment is not limited thereto. The peripheral region NAA may be disposed on one side or a side of the active region AA, or may be omitted.

The active region AA may be a region in which a pixel PX is disposed, and the peripheral region NAA may be a region in which the pixel PX is not disposed. The peripheral region NAA is a region in which the image IM (see FIG. 1) is not displayed.

The display module DM may include the display panel DP and the circuit board DC.

In the display module DM, regions NBA1, BA, and NBA2 arranged or disposed in the first direction DR1 in a plan view may be defined. Each of the regions NBA1, BA, and NBA2 is defined according to the type of operation of the display panel DP.

For example, in the display module DM, a first region NBA1, a second region NBA2, and a third region BA between the first region NBA1 and the second region NBA2 may be defined. The first region NBA1 may include the active region AA, and may overlap a portion of the peripheral region NAA. The second region NBA2 may be defined at one end or an end of the display panel DP in the first direction DR1. The second region NBA2 may overlap another portion of the peripheral region NAA. The circuit board DC may be connected to the second region NBA2 of the display panel DP.

The third region BA may be bent around a bending axis BX which is parallel to the second direction DR2.

As illustrated in FIG. 4, in case that the third region BA is bent, a portion of the display module DM corresponding to the second region NBA2 may be disposed below a portion of the display module DM corresponding to the first region NBA1. For example, the second region NBA2 may overlap a portion of the first region NBA1 in a plan view.

On the first direction DR1, the length of the first region NBA1 may be greater than the length of the second region NBA2 and the length of the third region BA. Accordingly, in case that the display module DM is bent, the second region NBA2 may not be visually recognized from above the first region NBA1.

The circuit board DC may be connected to one side or a side of the second region NBA2 of the display module DM in the first direction DR1. For example, the flexible film CB included in the circuit board DC is connected to one side or a side of the display panel DP overlapping the second region NBA2. The flexible film CB may be electrically connected to the display module DM through an adhesive member now shown. The adhesive member may be a transparent adhesive or an anisotropic conductive film. The driving circuit DV may be mounted on an upper surface of the flexible film CB.

The display module DM may include the first protective layer BPR overlapping the third region BA. The first protective layer BPR may be disposed on one surface or a surface of the third region BA, and may contact one surface or a surface of the third region BA.

In an embodiment, the display module DM may further include the second protective layer BPL overlapping the third region BA. The second protective layer BPL may be disposed on the other surface of the third region BA, and may contact the other surface of the third region BA.

However, the embodiment is not limited embodiment thereto. The second protective layer BPL may be omitted.

In an embodiment, each of the first protective layer BPR and the second protective layer BPL may be bent together with the third region BA. The first protective layer BPR and the second protective layer BPL may perform a function of reducing stress generated as the display module DM is bent.

Based on FIG. 4, the first protective layer BPR may be disposed on the inside of the third region BA, and the second protective layer BPL may be disposed on the outside of the third region BA. The first protective layer BPR may support the third region BA which is bent. The modulus of the first protective layer BPR may be about 1 MPA or greater. The second protective layer BPL may protect the third region BA from an external impact and the like within the spirit and the scope of the disclosure.

The first protective layer BPR overlaps the third region BA. For example, the first protective layer BPR may overlap more than half of the third region BA. In an embodiment, the first protective layer BPR may not overlap the first region NBA1 and the second region NBA2.

The first protective layer BPR may include at least one of an acrylic resin, an epoxy-based resin, or a silicon-based resin. For example, the first protective layer BPR may include two or more different types of resins among an acrylic resin, an epoxy-based resin, or a silicon-based resin, or one type of resin thereof.

The second protective layer BPL may overlap at least the third region BA, and may overlap the first region NBA1 and the second region NBA2.

Figure 5:
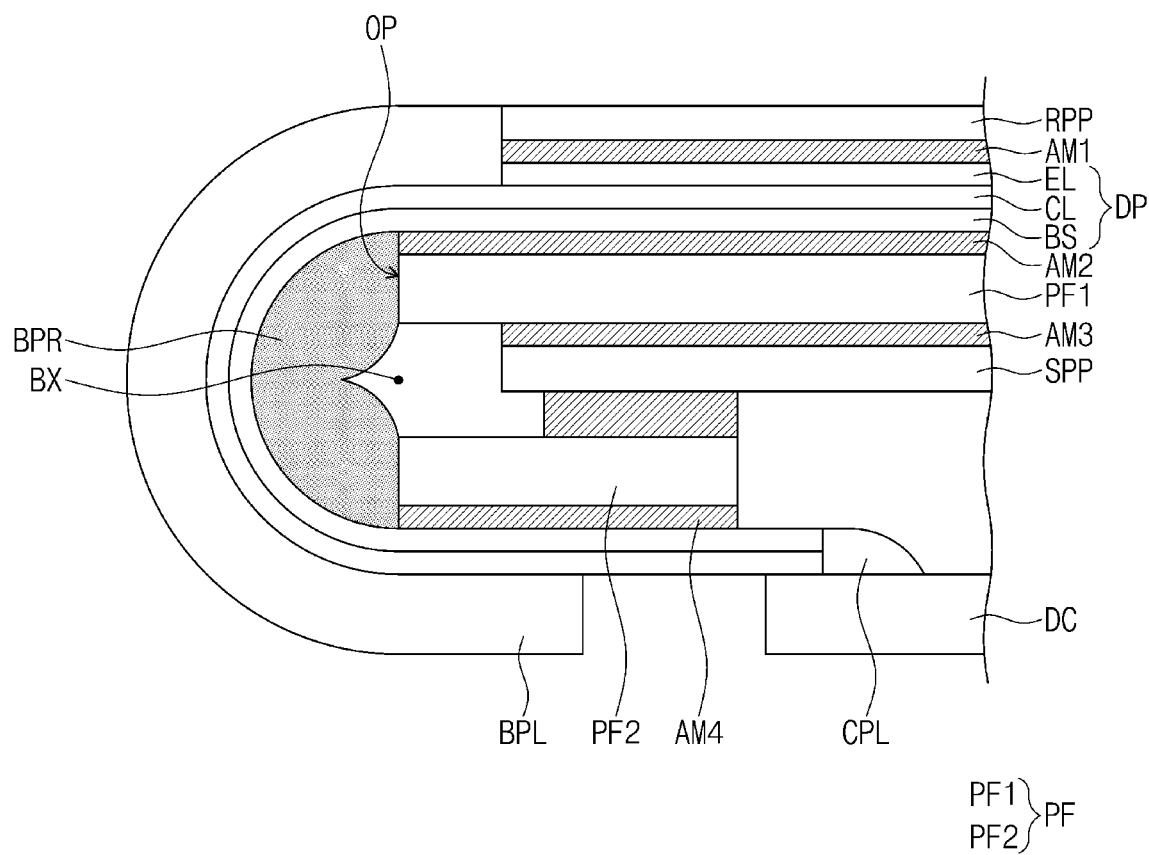
FIG. 5 is a schematic cross-sectional view of a display module according to an embodiment.

FIG. 5 is a schematic cross-sectional view of a display module according to an embodiment.

Referring to FIG. 5, the display module DM of an embodiment may include the display panel DP, a reflection prevention layer RPP, a protective film PF, a support panel SPP, the circuit board DC, the first protective layer BPR, and the second protective layer BPL. The display panel DP may include a base layer BS, a circuit layer CL disposed on an upper surface of the base layer BS, and a light emitting device layer EL disposed on the circuit layer CL.

The first protective layer BPR is disposed on a lower surface of the base layer BS, and the second protective layer BPL may be disposed on an upper surface of the circuit layer CL.

Each of the first protective layer BPR and the second protective layer BPL may be bent around the bending axis BX.

The display panel DP may be a flexible display panel. The display panel DP may be, for example, an organic light emitting display panel, an inorganic light emitting display panel, or a quantum dot light emitting display panel. Hereinafter, the display panel DP is described as being an organic light emitting display panel. However, the embodiment is not limited thereto.

On the display panel DP, the input sensing unit to be described later may be disposed. The input sensing unit will be described in detail later.

The light emitting device layer EL may include a light emitting device which emits light. For example, an organic light emitting material may be included. The circuit layer CL may include a wire, a device, or the like for driving the light emitting device or the like within the spirit and the scope of the disclosure.

On the display panel DP, the reflection prevention layer RPP may be disposed. The reflection prevention layer RPP reduces the reflectance of external light incident from an upper side of the window WP. The reflection prevention layer RPP may include a polarizing film and/or a phase retardation film. Depending on an operation principle of the reflection prevention layer RPP, the number of phase retardation films and the phase retardation length of a phase retardation film may be determined. The reflection prevention layer RPP may include color filters.

In an embodiment, the reflection prevention layer RPP may be omitted. For example, the reflection prevention layer RPP may be integrated into the display panel DP through a continuous process. In an embodiment, color filters may be disposed in the display panel DP, and the color filters may have the function of the reflection prevention layer RPP.

The protective film PF may be disposed on a lower surface of the display panel DP. For example, the protective film PF may be disposed on a lower surface of the base layer BS. In an embodiment, the protective film PF may include a first protective film PF1 and a second protective film PF2 which are disposed spaced apart from each other. The first protective film PF1 may be disposed overlapping the first region NBA1 (see FIG. 4) of the display panel DP, and the second protective film PF2 may be disposed overlapping the second region NBA2 (see FIG. 4) of the display panel DP.

The protective films PF1 and PF2 may include a plastic film as a base layer. The protective films PF1 and PF2 may include a plastic film containing any one selected from the group consisting of polyethersulfone (PES), polyacrylate (PAR), polyetherimide (PEI), polyethyelene napthalate (PEN), polyethyleneterephthalate (PET), polyphenylene sulfide (PPS), polyarylate, polyimide (PI), polycarbonate (PC), poly(arylene ethersulfone), and a combination thereof.

A material constituting the protective films PF1 and PF2 is not limited to plastic resins, and may include an organic/inorganic composite material. The protective films PF1 and PF2 may include a porous organic layer, and an inorganic matter filled in pores of the organic layer.

In an embodiment, the protective film PF may be omitted.

The support panel SPP may be disposed on back surfaces of the protective films PF1 and PF2 to support the display panel DP and the protective film PF. The support panel SPP may include at least one of a support layer, a cushion layer, or a heat dissipating layer.

The support panel SPP include may include a metal plate having rigidity greater than or equal to a reference value. The support panel SPP may be a stainless steel plate. The support panel SPP may be black in order to block external light incident on the display panel DP.

The support panel SPP may include a heat dissipating member. The heat dissipating member may disperse heat generated inside the display module DM to the outside. For example, the heat dissipating member may include a graphite layer.

The support panel SPP may include a polymer resin layer. The polymer resin layer may be to alleviate an impact such as pressing by an external stimulus.

The circuit board DC may be connected to one end or an end of the display panel DP to generate an electrical signal to be provided to the display panel DP or process an electrical signal provided from the display panel DP. One end or an end of the circuit board DC may be connected to the display panel DP, and an additional circuit board may be connected to the other end or another end of the circuit board DC. On the additional circuit board, passive elements and active elements and the like may be mounted. The additional circuit board may be electrically connected to a mother board of a display device through an electronic component connector.

The display module DM may include a connection part protective layer CPL disposed at a connection part where the display panel DP and the circuit board DC are connected. The connection part protective layer CPL may be disposed at a boundary portion where the display panel DP and the circuit board DC are connected, and may contact one side surface or a side surface of the display panel DP and one surface or a surface of the circuit board DC. The connection part protective layer CPL may prevent penetration of moisture, oxygen, and the like to prevent corrosion of a pad part and the like disposed at a connection portion, and may serve to reinforce connection strength between the display panel DP and the circuit board DC to ensure connection reliability. The connection part protective layer CPL may include an acrylic polymer, a thiol-based polymer, or the like within the spirit and the scope of the disclosure.

The display module DM may further include a first adhesive member AM1 and a second adhesive member AM2. The first adhesive member AM1 may be to bond the display panel DP and the reflection prevention layer RPP. The second adhesive member AM2 may be to bond the second protective film PF2 and the support panel SPP.

Each of the first adhesive member AM1 and the second adhesive member AM2 may be a pressure sensitive adhesive (PSA) film, an optically clear adhesive (OCA) film, or an optically clear resin (OCR). The first adhesive member AM1 and the second adhesive member AM2 include a photocuring adhesive material or a thermal curing adhesive material, and the material thereof is not particularly limited.

In an embodiment, at least one of the first adhesive member or layer AM1 and the second adhesive member or layer AM2 may be omitted. By way of example, the display module DM may include an additional adhesive member, for example, a third adhesive member AM3 and/or a fourth adhesive member AM4 in addition to the first adhesive member AM1 and the second adhesive member AM2.

FIG. 2 to FIG. 5 describe an embodiment in which the display module DM may include the first protective layer BPR and the second protective layer BPL. However, the embodiment is not limited thereto. The display module DM of an embodiment may include the first protective layer BPR, but not the second protective layer BPL.

Figure 6:
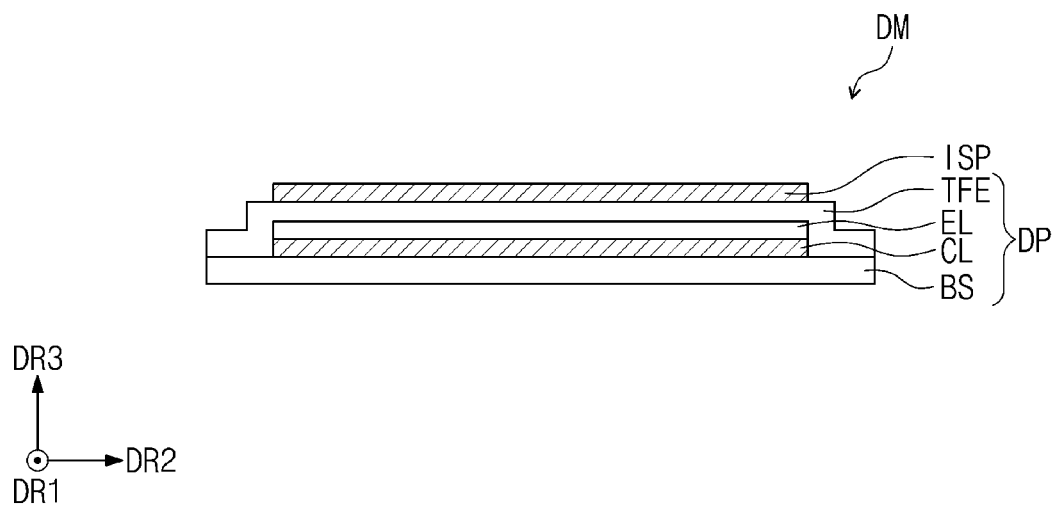
FIG. 6 is a schematic cross-sectional view of a display module according to an embodiment.

FIG. 6 is a schematic cross-sectional view of a display module according to an embodiment.

Referring to FIG. 6, the display module DM may include the display panel DP and an input sensing unit ISP. The input sensing unit ISP may be referred to as an input sensing layer, a sensor layer, or the like within the spirit and the scope of the disclosure.

In an embodiment, the input sensing unit ISP may be formed in a continuous process with the display panel DP.

The input sensing unit ISP may include insulation layers and conductive layers. The conductive layers may constitute a sensing electrode that senses an external input, a sensing line connected to the sensing electrode, and a sensing pad connected to the sensing line.

The display panel DP may include the base layer BS, the circuit layer CL, the light emitting device layer EL, and an encapsulation layer TFE.

The base layer BS may be a silicon substrate, a plastic substrate, a glass substrate, an insulation film, or a laminated structural body including insulation layers. The base layer BS may be a display substrate on which the circuit layer CL, the light emitting device layer EL, and the like are disposed.

The circuit layer CL may be disposed on the base layer BS. The circuit layer CL may include insulation layers, conductive layers, and a semiconductor layer. The conductive layers of the circuit layer CL may constitute signal lines or a control circuit of a pixel.

The light emitting device layer EL may be disposed on the circuit layer CL. The light emitting device layer EL may be a layer which generates light by including a light emitting device. For example, the light emitting device layer EL of an organic light emitting display panel may include at least one of an organic light emitting material, a quantum dot, or a quantum load.

Figure 7:
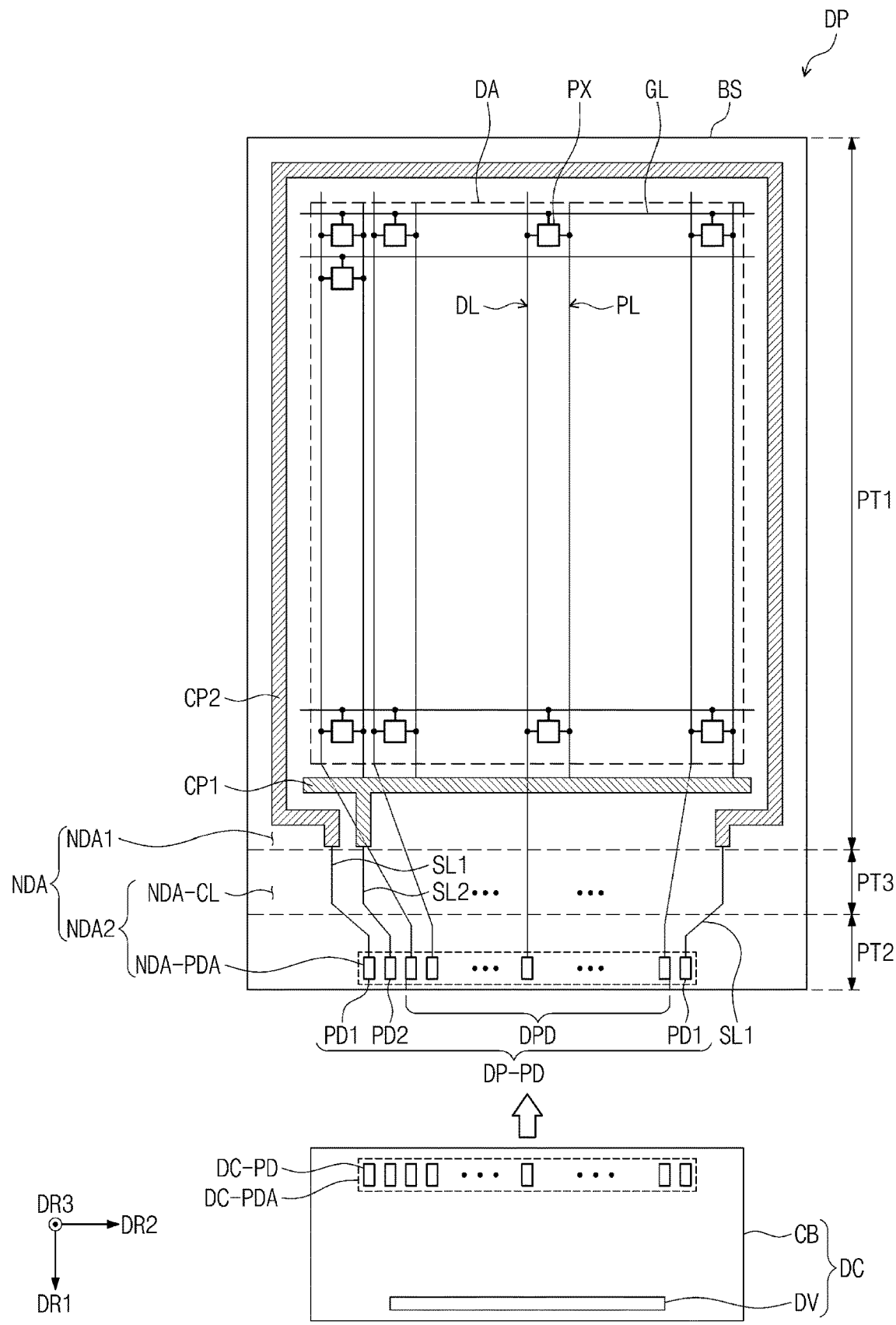
FIG. 7 is a schematic plan view of a display panel according to an embodiment.

FIG. 7 is a schematic plan view of a display panel according to an embodiment. In FIG. 7, the circuit board DC connected to the display panel DP is additionally illustrated.

Referring to FIG. 7, the display panel DP may include a display region DA and a non-display region NDA which are distinguished from each other in a plan view. The display region DA may correspond to the active region AA illustrated in FIG. 3 and FIG. 4. The non-display region NDA may correspond to the peripheral region NAA illustrated in FIG. 3 and FIG. 4. The non-display region NDA is illustrated as surrounding the display region DA, but the non-display region NDA may be disposed on one side or a side of the display region DA or may be adjacent to the display region DA, or may be omitted.

The non-display region NDA may include a first non-display region NDA1 and a second non-display region NDA2. The first non-display region NDA1 may surround the display region DA. On the first non-display region NDA1, conductive patterns CP1 and CP2 to be described later may be disposed. In an embodiment, the first non-display region NDA1 and the display region DA may entirely overlap the first region NBA1.

The second non-display region NDA2 may be defined adjacent to one side or a side of the first non-display region NDA1 in the first direction DR1. The second non-display region NDA2 may include a wiring region NDA-CL and a panel pad region NDA-PDA. The panel pad region NDA-PDA is defined on one side or a side of the second non-display region NDA2 in the first direction DR1. The panel pad region NDA-PDA may be a region to which the circuit board DC is connected. The wiring region NDA-CL may be a region between the first non-display region NDA1 and the panel pad region NDA-PDA.

In a plan view, the display panel DP may include conductive patterns CP1 and CP2, signal lines DL, GL, PL, SL1, and SL2, panel pads DP-PD, and pixels PX. The pixels PX are disposed in the display region DA. Each of the pixels PX may include a light emitting device and a pixel driving circuit connected thereto.

As described above with reference to FIG. 5, the display panel DP may include the base layer BS, the circuit layer CL disposed on an upper surface of the base layer BS, and the light emitting device layer EL disposed on the circuit layer CL.

The signal lines DL, GL, PL, SL1, and SL2, the conductive patterns CP1 and CP2, the panel pads DP-PD, and pixel driving circuits may be included in the circuit layer CL illustrated in FIG. 5. The light emitting device included in the pixel PX may be included in the light emitting device layer EL illustrated in FIG. 5.

The base layer BS may be to provide a base surface to the light emitting device layer EL and the circuit layer CL.

In the disclosure, the base layer BS may include a first portion PT1, a second portion PT2, and a third portion PT3 disposed between the first portion PT1 and the second portion PT2.

Referring to FIG. 3 and FIG. 7 together, the first portion PT1 may correspond to the first region NBA1 of the display module DM, the second portion PT2 may correspond to the second region NBA2 of the display module DM, and the third portion PT3 may correspond to the third region BA of the display module DM. For example, the third portion PT3 has flexibility and may be bent.

Referring back to FIG. 7, the first portion PT1 may overlap the display region DA and the first non-display region NDA1. In the first portion PT1, light emitting devices included in the pixels PX are disposed.

To the second portion PT2, the circuit board DC is connected. The second portion PT2 may overlap the panel pad region NDA-PDA.

The third portion PT3 may overlap the wiring region NDA-CL.

The signal lines DL, GL, PL, SL1, and SL2 are disposed across the first portion PT1, the second portion PT2, and the third portion PT3 of the base layer BS. The signal lines DL, GL, PL, SL1, and SL2 may include data lines DL, scan lines GL, a power line PL, a first signal line SL1, and a second signal line SL2.

The data lines DL are respectively connected to corresponding pixels PX among the pixels PX, and the scan lines GL are respectively connected to corresponding pixels PX among the pixels PX. The power line PL is connected to the pixels PX. The first signal line SL1 is connected to a first conductive pattern CP1, and the second signal line SL2 is connected to a second conductive pattern CP2.

The conductive patterns CP1 and CP2 may be disposed in the first non-display region NDA1. The conductive patterns CP1 and CP2 may include the first conductive pattern CP1 and the second conductive pattern CP2. The first conductive pattern CP1 and the second conductive pattern CP2 are insulated from each other. Illustratively, FIG. 7 illustrates that the first conductive pattern CP1 and the second conductive pattern CP2 are disposed spaced apart from each other on the first non-display region NDA1. However, in an embodiment, the first conductive pattern CP1 and the second conductive pattern CP2 may be disposed on different layers from each other. The first conductive pattern CP1 and the second conductive pattern CP2 may be disposed overlapping each other in a plan view.

The first conductive pattern CP1 may be connected to power lines PL extended from the display region DA. The power lines PL may be connected to a single first conductive pattern CP1 to provide a first power voltage of the same potential to each of the pixels PX.

The second conductive pattern CP2 may provide a second power voltage to each of the pixels PX.

The panel pads DP-PD are disposed in the panel pad region NDA-PDA. The panel pads DP-PD include a first signal pad PD1, a second signal pad PD2, and display signal pads DPD. The first signal pad PD1 is connected to the first signal line SL1. The second signal pad PD2 is connected to the second signal line SL2. The display signal pads DPD are connected to corresponding data lines DL. The circuit board DC is connected to the display signal pads DPD.

The flexible film CB of the circuit board DC may include board pads DC-PD electrically connected to the display panel DP. A region in which the board pads DC-PD are disposed is defined as a board pad region DC-PDA, and the board pad region DC-PDA may correspond to the panel pad region NDA-PDA of the display panel DP. The board pad region DC-PDA and the panel pad region NDA-PDA may be electrically connected through an anisotropic conductive film (ACF) or the like, or pads disposed in the board pad region DC-PDA and the panel pad region NDA-PDA may be connected to or directly connected to each other through ultrasonic bonding or the like within the spirit and the scope of the disclosure. Although not illustrated, the flexible film CB may further include signal lines (now shown) which connect the board pads DC-PD and the driving circuit DV. The driving circuit DV disposed on the circuit board DC may be mounted on or directly mounted on the display panel DP.

FIG. 7 illustrates that the first portion PT1, the second portion PT2, and the third portion PT3 of the base layer BS have a shape of a single body, but an embodiment is not limited thereto. For example, the second portion PT2 and the third portion PT3 may be a flexible printed circuit board. The base layer BS may include the first portion PT1 and a flexible printed circuit board connected to the first portion PT1. The flexible printed circuit board may include portions respectively correspond to the second portion PT2 and the third portion PT3.

For example, a portion connected to the first portion PT1 of the base layer BS and bent in the flexible printed circuit board may correspond to the third portion PT3 of the base layer BS. A portion to which the circuit board DC is connected and which opposes the first portion PT1 in the flexible circuit board may correspond to the second portion PT2. The flexible printed circuit board may include signal lines. The signal lines disposed on the flexible printed circuit board may be respectively connected to signal lines disposed in the first portion PT1. Hereinafter, a description will be made based on the base layer BS illustrated in FIG. 7.

Figure 8:
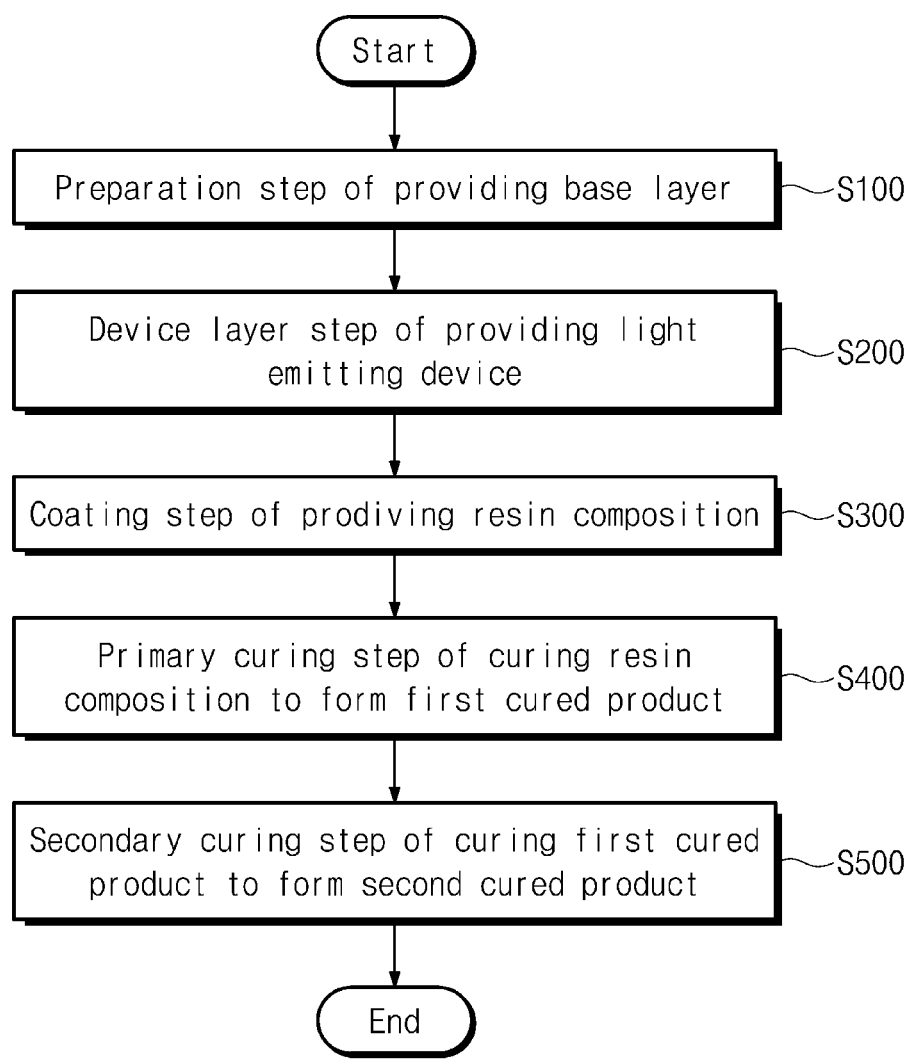
FIG. 8 is a flow chart showing steps of a method for manufacturing a display module according to an embodiment.

FIG. 8 is a flow chart showing steps of a method for manufacturing a display module according to an embodiment.

FIG. 9A to FIG. 9H are schematic cross-sectional views sequentially showing each step of a method for manufacturing a display module according to an embodiment.

Figure 10:
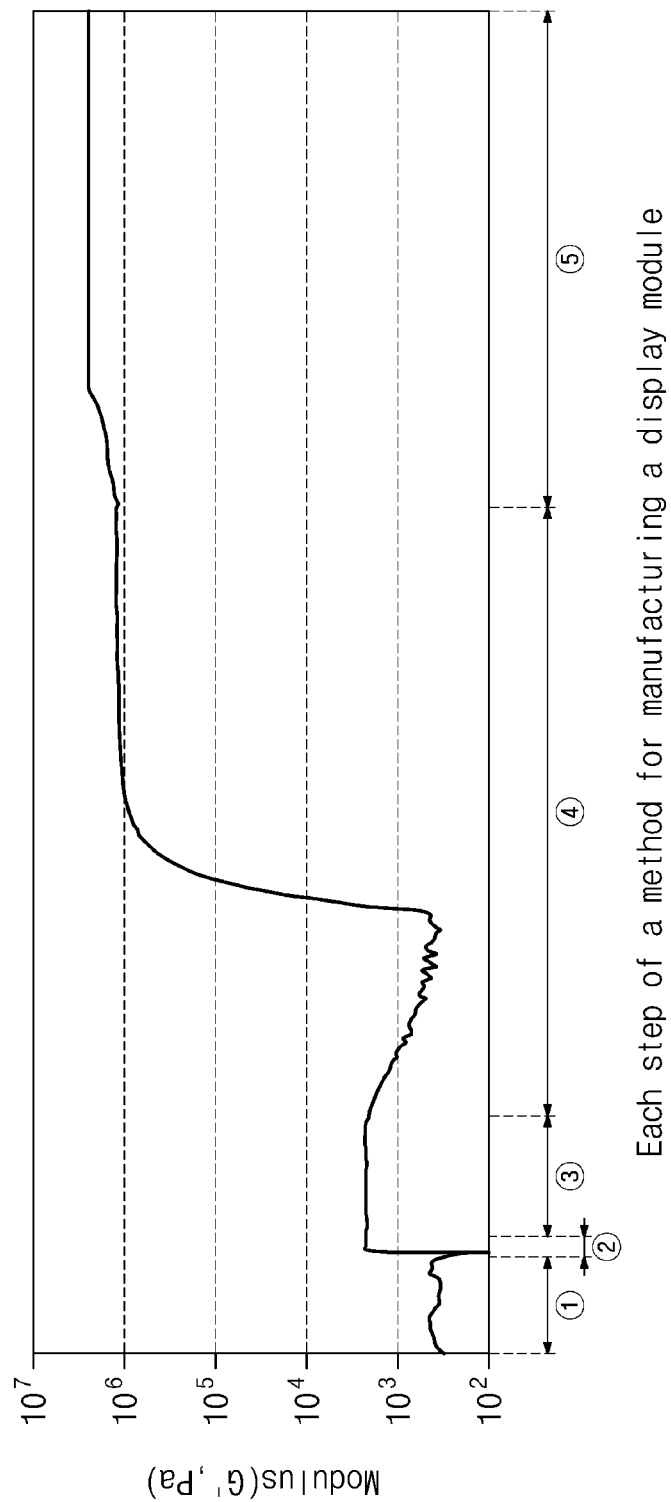
FIG. 10 is a graph showing the modulus value of a first protective layer according to each step of a method for manufacturing a display module according to an embodiment.

FIG. 10 is a graph showing the modulus value of a first protective layer according to each step of a method for manufacturing a display module according to an embodiment.

Hereinafter, in describing FIG. 8, FIG. 9A to FIG. 9H, and FIG. 10, the same reference numerals are given to the same components as those of FIG. 1 to FIG. 7, and detailed descriptions thereof will be omitted.

Referring to FIG. 8, a method for manufacturing a display module according to an embodiment may include a preparation step S100 of providing a base layer, a device layer step S200 of providing a light emitting device, a coating step S300 of providing a resin composition, a primary curing step S400 of curing the resin composition to form a first cured product, and a secondary curing step S500 of curing the first cured product to form a second cured product.

Figure 9A:
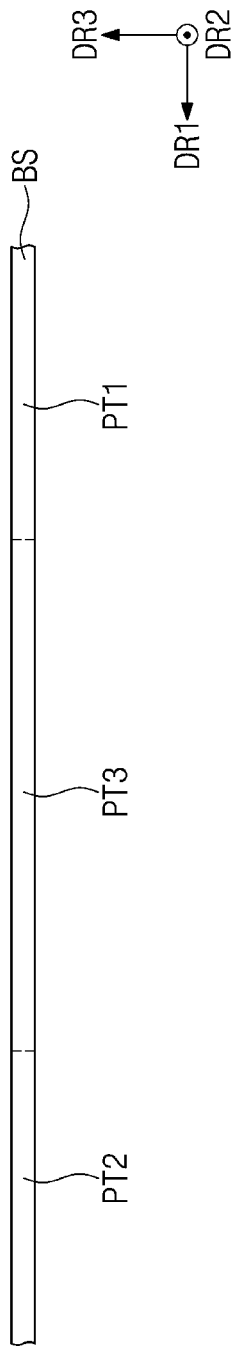
FIG. 9A to FIG. 9H are schematic cross-sectional views sequentially showing each step of a method for manufacturing a display module according to an embodiment.

Referring to FIG. 8 and FIG. 9A together, the preparation step S100 of providing a base layer is a step of providing the base layer BS including the first portion PT1, the second portion PT2, and the third portion PT3.

Figure 9B:
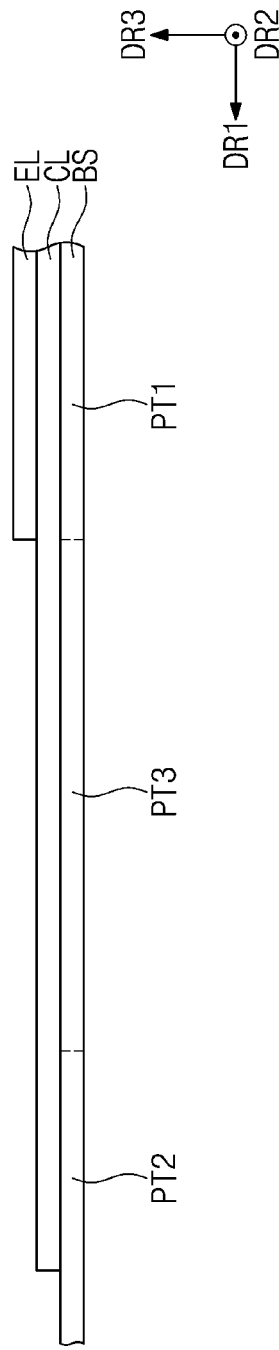

Referring to FIG. 8 and FIG. 9B together, the method for manufacturing a display module according to an embodiment may further include, after the preparation step S100, a step of providing the circuit layer CL on an upper surface of the base layer BS. The step of providing the circuit layer CL may be a step of providing the signal lines DL, GL, PL, SL1, and SL2 described with reference to FIG. 7 to the first portion PT1, the second portion PT2, and the third portion PT3.

The device layer step S200 of providing a light emitting device is a step of providing a light emitting device on an upper surface of the first portion PT1. For example, the device layer step S200 may be a step of providing the light emitting device layer EL on the circuit layer CL to overlap the first portion PT1.

For example, the circuit layer CL and the light emitting device layer EL may be provided by photolithography, deposition, coating, or the like within the spirit and the scope of the disclosure.

Figure 9C:
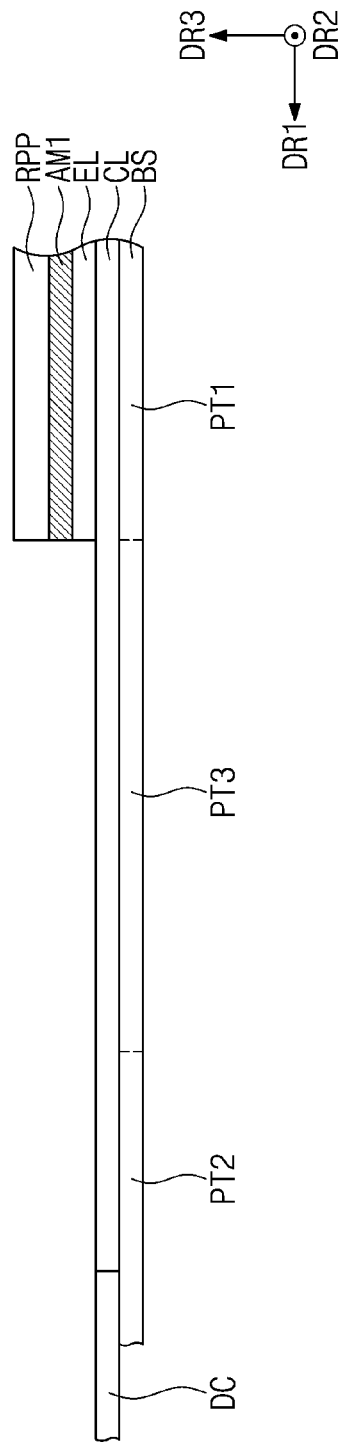

Referring to FIG. 8 and FIG. 9C together, the method for manufacturing a display module according to an embodiment may further include, after the device layer step S200, a step of providing the circuit board DC, the first adhesive layer AM1, and the reflection prevention layer RPP. The circuit board DC is illustrated as being connected to one end or an end of the circuit layer CL. The circuit board DC may be connected to one side or a side of the second portion PT2. The first adhesive member AM1 and the reflection prevention layer RPP may be provided to overlap the first portion PT1.

Figure 9D:
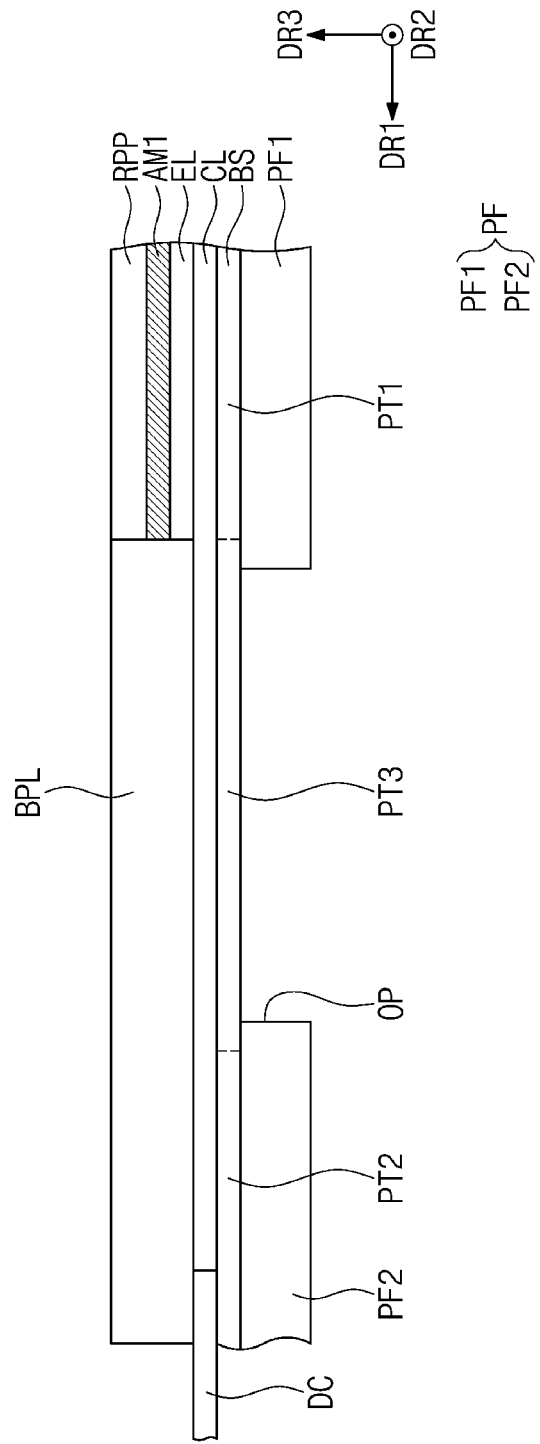

Referring to FIG. 8 and FIG. 9D together, the method for manufacturing a display module according to an embodiment may further include, after the device layer step S200, a step of providing the protective film PF and the second protective layer BPL.

The protective film PF may be provided or disposed on a lower surface of the base layer BS. An opening OP overlapping the third portion PT3 may be defined on the protective film PF. The opening OP may overlap at least a portion of the third portion PT3.

As the opening OP penetrates the protective film PF, the protective film PF may include the first protective film PF1 overlapping the first portion PT1 and the second protective film PF2 overlapping the second portion PT2.

In FIG. 9D, as the opening OP overlaps only a portion of the third portion PT3, the first protective film PF1 may overlap a portion of the third portion PT3, and the second protective film PF2 may overlap the other portion of the third portion PT3.

The second protective layer BPL may be provided or disposed on an upper surface of the circuit layer CL. The second protective layer BPL may overlap a portion of the first portion PT1, a portion of the second portion PT2, and the third portion PT3. The second protective layer BPL may be provided or disposed to cover or overlap one end or an end of each of the light emitting device layer EL, the first adhesive member AM1, and the reflection prevention layer RPP.

However, the method for manufacturing a display module of the disclosure is not limited thereto. In the method for manufacturing a display module of an embodiment, a step of providing the second protective layer BPL may be omitted.

Figure 9E:
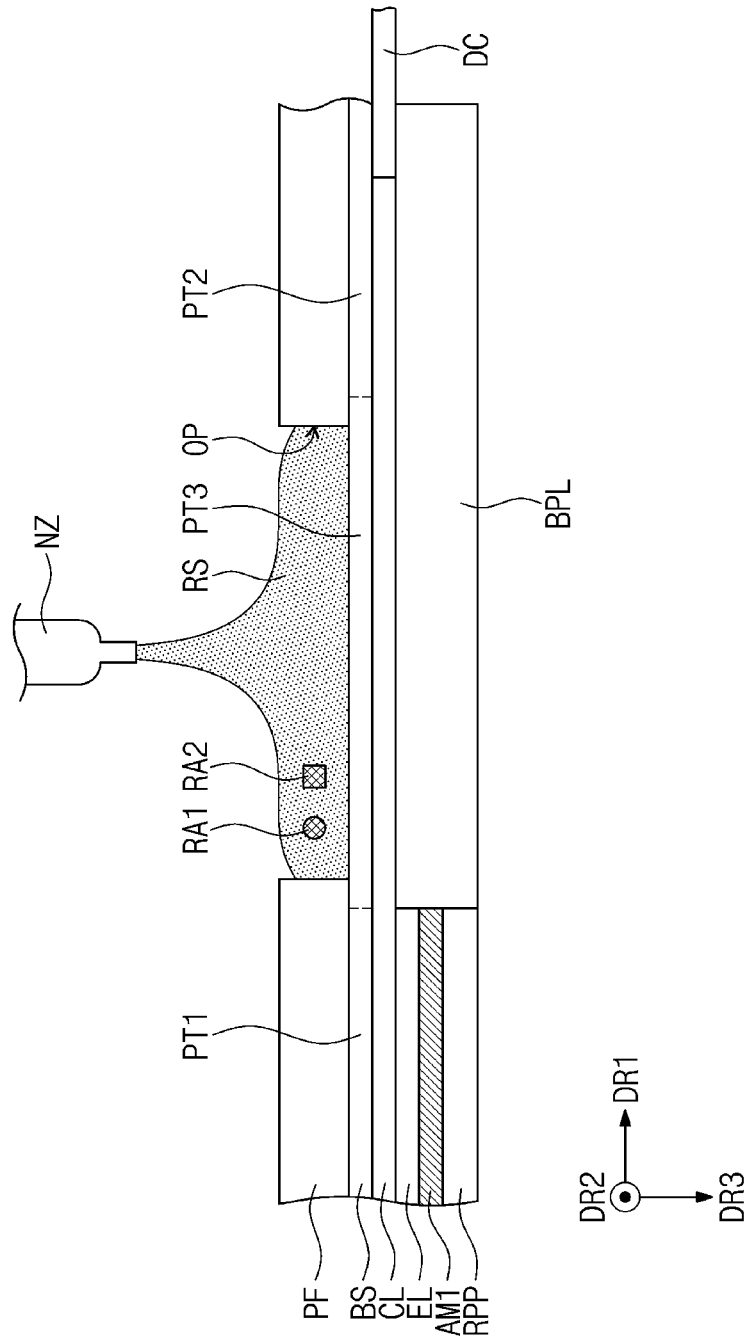

Referring to FIG. 8, FIG. 9E, and FIG. 10 together, the coating step S300 of providing a resin composition may be a step of providing a resin composition RS on a lower surface of the third portion PT3.

In the coating step S300, the resin composition RS is provided or disposed on one surface or a surface of the base layer BS. The resin composition RS may be provided to the base layer BS through a supply nozzle NZ. The resin composition RS may be provided by various methods. For example, the resin composition RS may be provided to the base layer BS by various methods such as jetting, slit coating, spin coating, transfer coating, or the like within the spirit and the scope of the disclosure.

In an embodiment, the resin composition RS may be provided or disposed on one surface or a surface of the base layer BS, and the second protective layer BPL may be provided or disposed on the other surface or another surface of the base layer BS. For example, the second protective layer BPL is provided or disposed on an upper surface of the base layer BS, and the resin composition RS is provided or disposed on a lower surface of the base layer BS. The upper surface and the lower surface of the base layer BS may be defined on the basis of the third direction DR3. For example, the upper surface of the base layer BS is a direction indicated by the third direction DR3, and the lower surface of the base layer BS is a direction indicated by the opposite direction of the third direction DR3.

The resin composition RS may be provided or disposed in the opening OP of the protective film PF. In case that the resin composition RS overflows out of the opening OP, process failure may occur. By being provided or disposed in the opening OP, the resin composition RS may be provided or disposed in the third portion PT3 of the base layer BS.

The resin composition RS of the disclosure may include a first reactant RA1 and a second reactant RA2. The first reactant RA1 is activated by a first method MH1, and the second reactant RA2 is activated by a second method MH2 different from the first method MH1.

In an embodiment, the first method MH1 may be UV curing. In an embodiment, the second method MH2 may be thermal curing, or natural curing.

In an embodiment, the first reactant RA1 may include either a photoinitiator or a latent catalyst. The first reactant RA1 may further include a monomer, an oligomer, and the like in addition to the photoinitiator and the latent catalyst.

Embodiments for the first reactant RA1 are shown in Table 1 below.

TABLE 1

| Classification | First reactant (RA1) |
| --- | --- |
| Example 1-1 | Acrylic monomer, acrylic oligomer, and acrylic radical photoinitiator |
| Example 1-2 | Epoxy-based monomer, epoxy-based oligomer, and epoxy-based cation photoinitiator |
| Example 1-3 | Latent catalyst and inhibitor |

For example, the first reactant RA1 of Example 1-1 may include an acrylic monomer, an acrylic oligomer, and an acrylic radical photoinitiator. For example, the first reactant RA1 of Example 1-2 may include an epoxy-based monomer, an epoxy-based oligomer, and an epoxy-based cation photoinitiator. For example, the first reactant RA1 of Example 1-3 may include a latent catalyst and an inhibitor. However, an embodiment of the first reactant RA1 is not limited thereto.

The first reactant RA1 of each of Example 1-1 to Example 103 may all be activated or cured by irradiating UV.

In an embodiment, the second reactant RA2 may include a thermal initiator, a material containing an isocyanate group, or a silicon-based material.

Embodiments for the second reactant RA2 are shown in Table 2 below.

TABLE 2

| Classification | Second reactant (RA2) |
| --- | --- |
| Example 2-1 | Urethane-based material containing isocyanate group |
| Example 2-2 | Epoxy-based monomer, epoxy-based oligomer, epoxy-based anion thermal initiator |
| Example 2-3 | Acrylic monomer, acrylic oligomer, and acrylic thermal initiator |

TABLE 2-continued

| Classification | Second reactant (RA2) |
| --- | --- |
| Example 2-4 | Epoxy-based monomer, epoxy-based oligomer, epoxy-based cation thermal initiator |
| Example 2-5 | Silicon-based monomer and silicon-based oligomer |

For example, the second reactant RA2 of Example 2-1 may include a urethane-based material containing an isocyanate group, and may further include a catalyst. For example, the second reactant RA2 of Example 2-2 may include an epoxy-based monomer, an epoxy-based oligomer, and an epoxy-based anion thermal initiator, and may further include a catalyst and an initiator. For example, the second reactant RA2 of Example 2-3 may include an acrylic monomer, an acrylic oligomer, and an acrylic thermal initiator, and may further include a catalyst and an initiator. For example, the second reactant RA2 of Example 2-4 may include an epoxy-based monomer, an epoxy-based oligomer, and an epoxy-based cation thermal initiator, and may further include a catalyst and an initiator. For example, the second reactant RA2 of Example 2-5 may include a silicon-based monomer and a silicon-based oligomer.

The second reactant RA2 of each of Example 2-1 to Example 2-5 may be cured by thermal curing or natural curing.

The resin composition RS of the disclosure may include any one of the first reactants RA1 of Example 1-1 to Example 1-3 and any one of the second reactants RA2 of Example 2-1 to Example 2-5.

For example, the resin composition RS of an embodiment may include the first reactant RA1 of Example 1-1 and the second reactant RA2 of Example 2-1. For example, in the resin composition RS of an embodiment, the first reactant RA1 may include an acrylic monomer, an acrylic oligomer, and an acrylic radical photoinitiator, and the second reactant RA2 may include an isocyanate group.

For example, the resin composition RS of an embodiment may include the first reactant RA1 of Example 1-1 and the second reactant RA2 of Example 2-2. For example, in the resin composition RS of an embodiment, the first reactant RA1 may include an acrylic monomer, an acrylic oligomer, and an acrylic radical photoinitiator, and the second reactant RA2 may include an epoxy-based monomer, an epoxy-based oligomer, and an epoxy-based anion thermal initiator.

For example, the resin composition RS of an embodiment may include the first reactant RA1 of Example 1-1 and the second reactant RA2 of Example 2-3. For example, in the resin composition RS of an embodiment, the first reactant RA1 may include an acrylic monomer, an acrylic oligomer, and an acrylic radical photoinitiator, and the second reactant RA2 may include an acrylic monomer, an acrylic oligomer, and an acrylic thermal initiator.

For example, the resin composition RS of an embodiment may include the first reactant RA1 of Example 1-2 and the second reactant RA2 of Example 2-4. For example, in the resin composition RS of an embodiment, the first reactant RA1 may include an epoxy-based monomer, an epoxy-based oligomer, and an epoxy-based cation photoinitiator, and the second reactant RA2 may include an epoxy-based monomer, an epoxy-based oligomer, and an epoxy-based cation thermal initiator.

For example, the resin composition RS of an embodiment may include the first reactant RA1 of Example 1-3 and the second reactant RA2 of Example 2-5. For example, in the resin composition RS of an embodiment, the first reactant RA1 may include a latent catalyst and an inhibitor, and the second reactant RA2 may include a silicon-based monomer and a silicon-based oligomer.

However, an embodiment of the resin composition RS is not limited thereto.

The resin composition RS of the disclosure may include the first reactant RA1 and the second reactant RA2 whose activation methods are different from each other, and thus, is completely cured through two curing steps. For example, the resin composition RS may be cured once to polymerize the first reactant RA1, and may be cured once more to polymerize the second reactant RA2, so that the resin composition RS may be completely cured.

The modulus value of the resin composition RS of the disclosure may change through two times of curing, and accordingly, the modulus value required in each step of the method for manufacturing a display module of the disclosure may be satisfied.

In an embodiment, the resin composition RS may further include inorganic particles in addition to a first reactant and a second reactant. For example, the inorganic particles may contain a silicon component or a calcium component. For example, the inorganic particles may contain silica gel, or calcium carbonate. The resin composition RS may have a Thixotropic index of 1 to 20 by including inorganic particles. The Thixotropic index of the resin composition RS of an example may be 1 to 10. The Thixotropic index (T.I) is defined as (viscosity at low shear rate)/(viscosity at high shear rate).

The resin composition RS may have a low modulus in the process of being coated on the base layer BS from the supply nozzle NZ. After being coated on the base layer BS, the resin composition RS may have an increased modulus. The resin composition RS coated from the supply nozzle NZ may be in a high shear state, and the resin composition RS provided or disposed on a lower surface of the base layer BS may be in a low shear state.

As the resin composition RS has a Thixotropic index of 1 to 20, the coating of the resin composition RS is facilitated, and after the coating, the flow of the resin composition RS may be controlled.

Referring to FIG. 10, the coating step S300 corresponds to section ①. For example, a modulus G' of the resin composition RS may be about $10^3$ Pa or lower. For example, the modulus G' of the resin composition RS may be in a range of about 0.001 Pa to about $10^3$ Pa.

The resin composition RS of the disclosure may have a low modulus and a low viscosity. Accordingly, the method for manufacturing a display module of the disclosure may optimize the coating amount and coating thickness of the resin composition RS in the coating step S300, and accordingly, processing costs and efficiency may be improved.

Figure 9F:
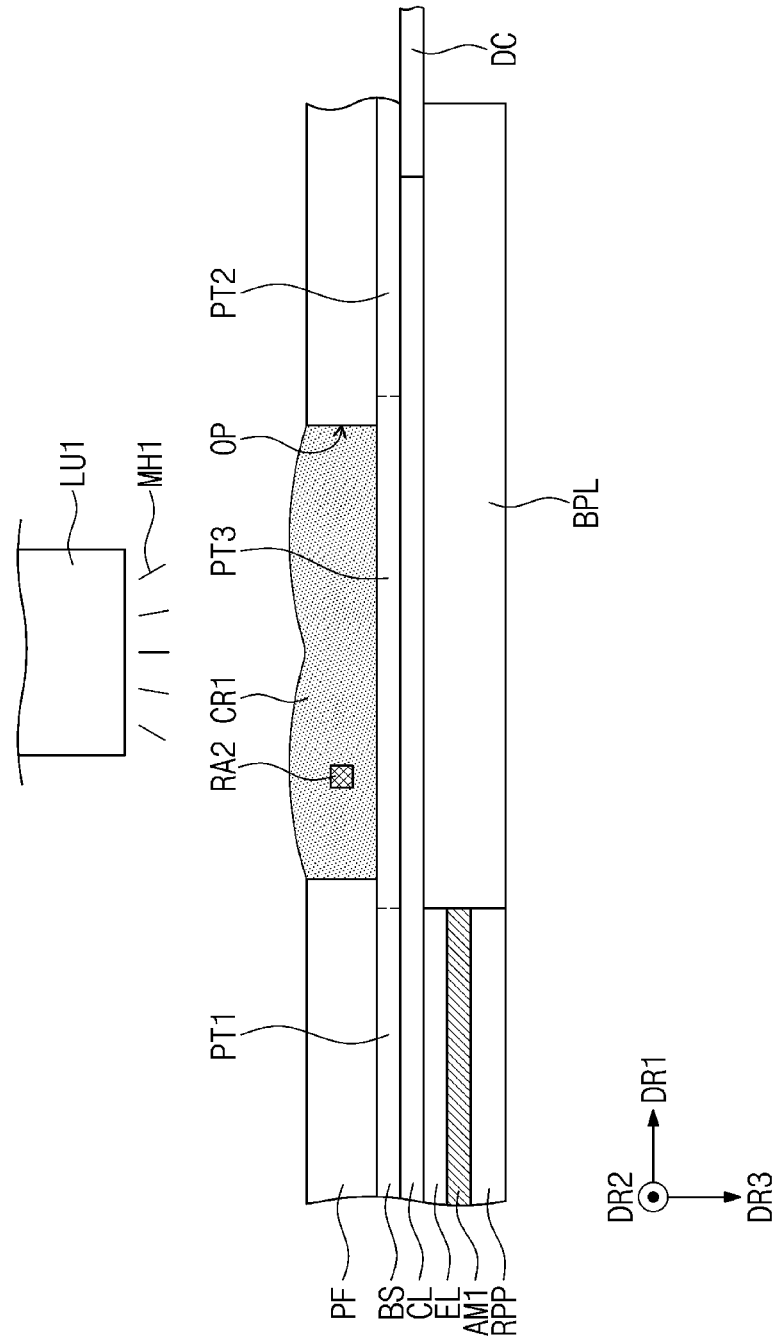

Referring to FIG. 8, FIG. 9F, and FIG. 10, the primary curing step S400 of curing a resin composition to form a first cured product is a step of curing the resin composition RS by the first method MH1 to form a first cured product CR1.

The first method MH1 may be to irradiate the resin composition RS (see FIG. 9E) with UV through a first light source LU1. In the primary curing step S400, the first reactant RA1 (see FIG. 9E) of the resin composition RS (see FIG. 9E) may react to generate the first cured product CR1 may be formed. The first cured product CR1 may have the second reactant RA2 remained therein.

For example, in case that the first reactant RA1 may include a photoinitiator, the photoinitiator irradiated with UV generates a radical, and the first reactant RA1 may be subjected to a polymerization reaction to generate the first cured product CR1.

For example, in the first reactant RA1 of Example 1-1, an acrylic radical photoinitiator may be irradiated with UV to form a radical. Accordingly, the first reactant RA1 may be cured to generate the first cured product CR1.

For example, in the first reactant RA1 of Example 1-2, an epoxy-based cation photoinitiator may be irradiated with UV to form a cation, and a ring opening reaction of epoxy ring may proceed. Accordingly, the first reactant RA1 may be cured to generate the first cured product CR1.

For example, in case that the first reactant RA1 may include a latent catalyst and an inhibitor, the latent catalyst irradiated with UV may be activated as a catalyst. The first cured product CR1 generated by the reaction of the first reactant RA1 including the latent catalyst and the inhibitor has not been subjected to a polymerization reaction, but may have increased reactivity compared to the resin composition RS. The first cured product CR1 with increased reactivity may be 100% cured in the following secondary curing step.

For example, in the first reactant RA1 of Example 1-3, a latent catalyst may be irradiated with UV to be activated as a catalyst.

The method for manufacturing a display module of the disclosure may form the first cured product CR1 in the primary curing step S400. The first cured product CR1 may be formed in the opening OP of the protective film PF. The first cured product CR1 may be disposed on a lower surface of the base layer BS, and may overlap the third portion PT3.

Referring to FIG. 10, the primary curing step S400 corresponds to section ②. In the section ②, the resin composition RS is subjected to UV curing to form the first cured product CR1. A modulus G' of the first cured product CR1 may be about $10^4$ Pa or lower. For example, the modulus G' of the first cured product CR1 may be in a range of about 0.001 Pa to about $10^4$ Pa.

Figure 9G:
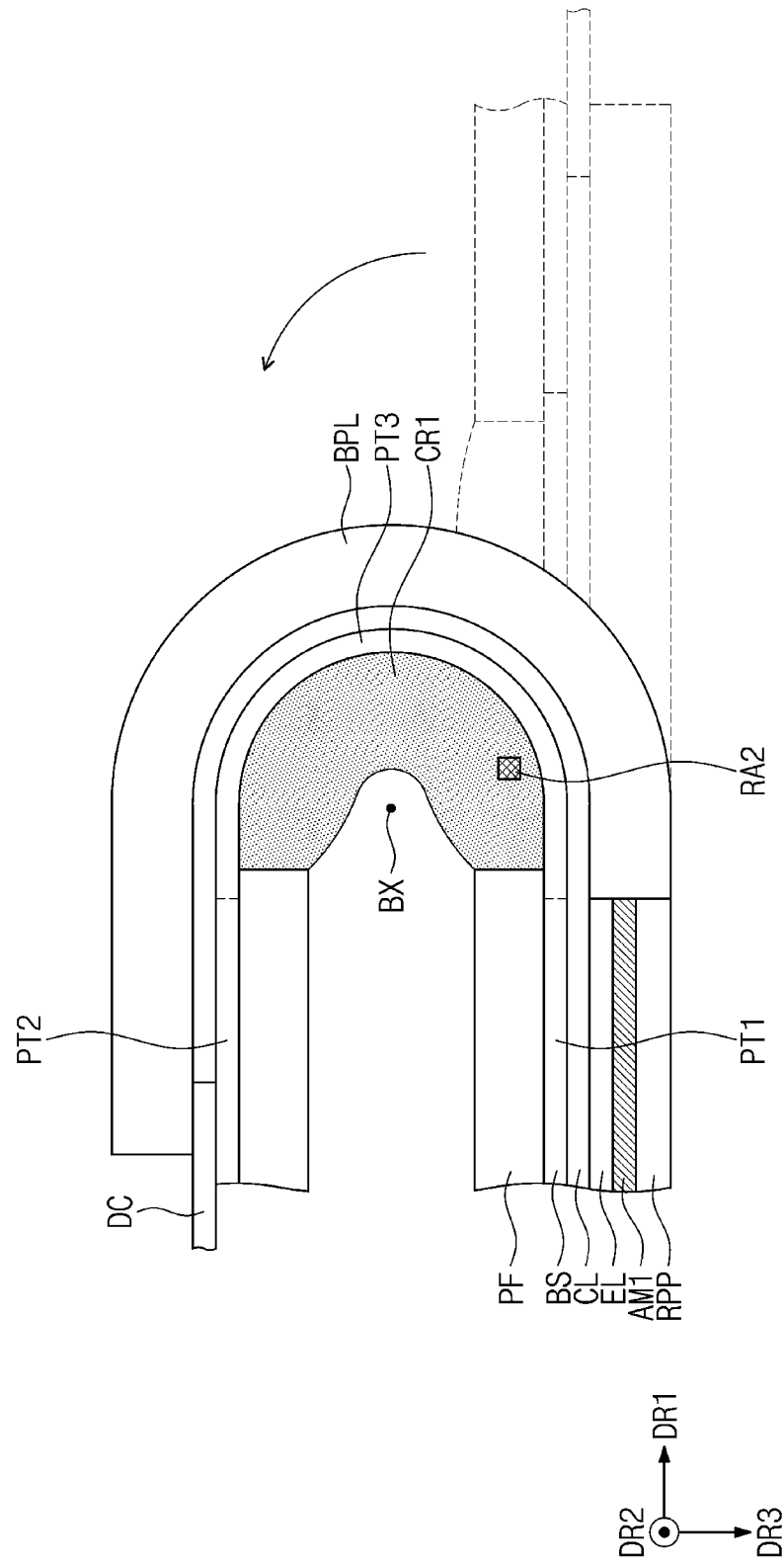

Referring to FIG. 8, FIG. 9G, and FIG. 10, the method for manufacturing a display module of an embodiment may further include, after the primary curing step S400, a step of bending the third portion PT3.

As the third portion PT3 is bent, the first cured product CR1 may be bent. After the bending, the first cured product CR1 may be disposed on the inside of the third portion PT3, and the second protective layer BPL may be disposed on the outside of the third portion PT3.

Referring to FIG. 10, the step in which the first cured product CR1 is bent corresponds to section ③. In section ③, a modulus G' value of the first cured product CR1 is the same as a modulus G' value of the first cured product CR1 in section ②. For example, the modulus G' value of the first cured product CR1 may be about $10^4$ Pa or lower. For example, the modulus G' of the first cured product CR1 may be in a range of about 0.001 Pa to about $10^4$ Pa. Since the first cured product CR1 has a low modulus value in the bending step, it is possible to prevent a problem in which the third portion PT3 and the circuit layer CL overlapping the third portion PT3 are cracked during the bending.

Figure 9H:
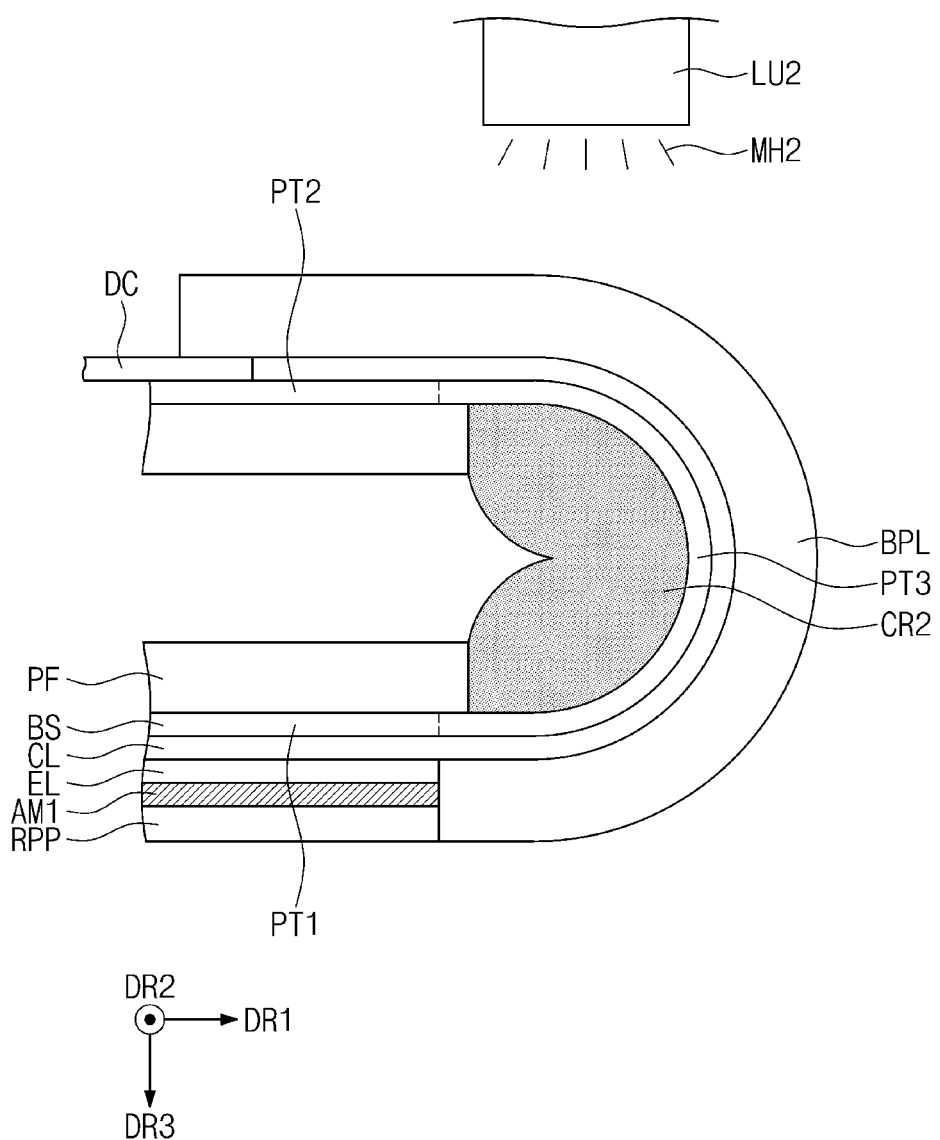

Referring to FIG. 8, FIG. 9H, and FIG. 10, the secondary curing step S500 of curing the first cured product CR1 to form a second cured product CR2 may be a step of curing the first cured product CR1 by a second method MH2 which is different from the first method MH1 to form the second cured product CR2.

The second method MH2 may be to apply heat to the first cured product CR1 (see FIG. 9F) through a second light source LU2, or subject the first cured product CR1 to natural curing.

In the secondary curing step S500, the second reactant RA2 (see FIG. 9G) of the first cured product CR1 (see FIG. 9G) is reacted and the second cured product CR2 may be formed.

For example, in case that the second reactant RA2 may include a urethane-based material containing an isocyanate group, an OH group of moisture in the air and the isocyanate group may react to cure the second reactant RA2.

For example, in the second reactant RA2 of Example 2-1, an isocyanate group of a urethane-based material containing an isocyanate group reacts with —OH of moisture to form a crosslink between urethane-based materials containing the isocyanate group. Accordingly, the first cured product CR1 may be cured to form the second cured product CR2.

For example, in case that the second reactant RA2 may include a thermal initiator, the thermal initiator provided with heat generates a radical, and the first cured product CR1 may be subjected to a polymerization reaction to generate the second cured product CR2.

For example, in the second reactant RA2 of Example 2-2, an epoxy-based anion thermal initiator may be heated to generate an anion, and a ring opening reaction of epoxy ring may proceed. Accordingly, the first cured product CR1 may be cured to form the second cured product CR2.

For example, in the second reactant RA2 of Example 2-3, an acrylic thermal initiator may be heated to generate a radical, and the first cured product CR1 may be subjected to a polymerization reaction to generate the second cured product CR2.

For example, in the second reactant RA2 of Example 2-4, an epoxy-based cation thermal initiator may be heated to generate a cation, and a ring opening reaction of epoxy ring may proceed. Accordingly, the first cured product CR1 may be subjected to a polymerization reaction to generate the second cured product CR2.

For example, in case that the first cured product CR1 may include the catalyst activated in the primary curing step S400 and the second reactant RA2, the second reactant RA2 provided with heat is subjected to a polymerization reaction by the catalyst to form the second cured product CR2.

For example, the first cured product CR1 may include the catalyst activated in the primary curing step S400 and the second reactant RA2 of Example 2-4. In case that applied with heat, a silicon monomer and a silicon oligomer included in the second reactant RA2 may form a crosslink by a hydrosilylation reaction. Accordingly, the first cured product CR1 may be cured to form the second cured product CR2.

Referring to FIG. 10, the secondary curing step S500 corresponds to section ④. In section ④, the first cured product CR1 is thermally cured or naturally cured to form the second cured product CR2. A modulus G' of the second cured product CR2 may be about $10^6$ Pa or higher. Accordingly, the second cured product CR2 may have high rigidity, and may support the third portion PT3 and the circuit layer CL overlapping the third portion PT3. For example, the second cured product CR2 may support and protect wires of circuit layer CL disposed in the third portion PT3.

Section ⑤ corresponds to after the secondary curing step S500. Even after the secondary curing step S500, the modulus G' of the second cured product CR2 may be maintained at about 10⁶ Pa or higher. In section ⑤, the second cured product CR2 may correspond to the first protective layer BPR described above.

The method for manufacturing a display module of the disclosure may include coating a resin composition on a bending region of a base layer, primarily curing the resin composition to provide a first cured product having a low modulus, bending the bending region, and secondarily curing the first cured product to provide a second cured product having a high modulus to provide a display module with improved reliability.

A display module of the disclosure may include a first protective layer disposed on a bending region so that the strength of the display module overlapping the bending region may be improved, and the durability of the display module may be improved.

Table 3 below shows the modulus value of each of a resin composition of Example A1, a resin composition of Comparative Example A1, and a resin composition of Comparative Example B1 after primary curing and the modulus value thereof after secondary curing.

The resin composition of Example A1 may include an acrylic monomer, an acrylic oligomer, and an acrylic radical photoinitiator as a first reactant, and may include an epoxy-based monomer, an epoxy-based oligomer, and an epoxy-based anion thermal initiator as a second reactant.

The resin composition of Comparative Example A1 may include a latent platinum catalyst and an inhibitor as a first reactant, and may include a silicon-based monomer and a silicon-based oligomer as a second reactant.

The resin composition of Comparative Example B1 may include a latent platinum catalyst and an inhibitor as a first reactant, and may include a silicon-based monomer and a silicon-based oligomer as a second reactant. The content of the latent platinum catalyst included in Comparative Example B1 is 5 times the content of the latent platinum catalyst included in Comparative Example A1.

In Table 3, the primary curing is UV curing, and the secondary curing is thermal curing.

TABLE 3

| Classification | Example A1 | Comparative Example A1 | Comparative Example B1 |
|---|---|---|---|
| Modulus (MPa) after primary curing | 0.002 | 0.002 | 0.11 |
| Modulus (MPa) after primary curing and secondary curing | 9.73 | 0.087 | 0.509 |

Referring to Table 3, Example A1 satisfies a modulus value in the range of about 10⁴ Pa or lower after the primary curing and a modulus value in the range of about 10⁶ Pa or higher after the secondary curing. Comparative Example A1 satisfies a modulus value in the range of about 10⁴ Pa or lower after the primary curing. However, Comparative Example A1 does not satisfy a modulus value in the range of about 10⁶ Pa or higher after the secondary curing.

Comparative Example B1 does not satisfy a modulus value in the range of about 10⁴ Pa or lower after the primary curing. Comparative Example B1 does not satisfy a modulus value in the range of about 10⁶ Pa or higher after the secondary curing.

Table 4 below shoes the evaluation of properties of a bending portion of a display module. The bending portion of the display module refers to a portion of the display module DM overlapping the third region BA described above.

Referring to Table 3 and Table 4 together, the display module of each of Example A2, Comparative Example A2, and Comparative Example B2 of Table 4 respectively may include, inside the bending portion, a cured product obtained by double curing the resin composition of each of Example A1, Comparative Example A1, and Comparative Example B1 of Table 1. For example, the cured product obtained by double curing the resin composition of each of Example A1, Comparative Example A1, and Comparative Example B1 may correspond to the first protective layer described above.

A display module of Reference Example is a display module not including a protective layer inside a bending portion.

In the items of Table 4, environment reliability was evaluated by Unbiased HAST (UHAST) under the conditions of temperature of about 85° C. and humidity of about 85%. For example, the environment reliability evaluation was conducted by leaving the display module of each of Example A2, Comparative Example A2, and Comparative Example B2 to stand in a constant temperature and humidity chamber of a temperature of about 85° C. and a humidity of about 85% and measuring how long it took for defects to occur. In case that there were no defects for about 500 hours, it was evaluated as good, and the evaluation was terminated.

In the items of Table 4, the dynamic impact strength evaluation was conducted by measuring the strength of a bending portion of a display module using a charpy impact tester. For example, the dynamic impact strength evaluation was conducted by applying a weight for hitting to each bending portion of the display module of each of Example A2, Comparative Example A2, and Comparative Example B2, and measuring the minimum value of an angle of the weight at which a defect occurred in the bending portion of the display module while increasing the angle of the weight.

TABLE 4

| Classification | Example A2 | Comparative Example A2 | Comparative Example B2 | Reference Example |
|---|---|---|---|---|
| Environment reliability (UHAST, 85° C./85%) | 500 hr, 0 F./18 | 500 hr, 0 F./16 | 120 hr, 1 F./15 | — |
| Dynamic impact strength | 9.5° | 6.0° | 7.5° | 4.0° |

Referring to Table 4, the display module of Example A2 had no defects in all 18 display modules for about 500 hours in case that the environmental reliability was evaluated, and the dynamic impact strength was measured to be about 9.5°. The display module of Comparative Example A2 had no defects in all 16 display modules for about 500 hours in case that the environment reliability was evaluated, and the dynamic impact strength was measured to be about 6.0°. The display module of Comparative Example B2 had one defect in 15 display modules after about 120 hours had elapsed in case that the environment reliability was evaluated, and the dynamic impact strength was measured to be about 7.5°.

In the case of the display module of Reference Example, the environmental reliability evaluation was not conducted, and the dynamic impact strength was measured to be about 4.0°.

Referring to Table 3 and Table 4 together, the resin compositions of Example A1 and Comparative Example A1 satisfy a modulus value in the range of about 10⁴ Pa or lower after primary curing. Accordingly, the display modules of Example A2 and Comparative Example A2 did not have defects in case that the environment reliability evaluation was conducted. On the contrary, the resin composition of Comparative Example B1 had a modulus value greater than about $10^4$ Pa after primary curing, and accordingly, had defects in case that the environment reliability evaluation was conducted.

The resin composition of Example A1 satisfies a modulus value in the range of about $10^6$ Pa or higher after secondary curing. Accordingly, the dynamic impact strength of the display module of Example A2 was measured to be excellent.

Each of the resin compositions of Comparative Example A1 and Comparative Example B1 had a modulus value measured lower than about $10^6$ Pa after secondary curing. Accordingly, the dynamic impact strength of each of the display modules of Comparative Example A2 and Comparative Example B2 was lower than the dynamic impact strength of the display module of Example A2.

The display module of Reference Example did not include a protective layer inside a bending portion, and accordingly, had dynamic impact strength measured the lowest.

The resin composition of the disclosure satisfies a modulus value in the range of about $10^4$ Pa or lower after primary curing, and thus, may exhibit excellent environment reliability, and satisfies a modulus value in the range of about $10^6$ Pa or higher after secondary curing, and thus, may have improved dynamic impact strength.

The method for manufacturing a display module of the disclosure may include a step of double curing a resin composition, wherein the resin composition satisfies a modulus value in the range of about $10^4$ Pa or lower after primary curing, and satisfies a modulus value in the range of about $10^6$ Pa or higher after secondary curing, so that the reliability of the manufacturing method of a display module may be improved.

The display module of the disclosure may include, inside a bending portion, a protective layer formed by double curing a resin composition satisfying a modulus value in the range of about $10^4$ Pa or lower after primary curing, and satisfying a modulus value in the range of about $10^6$ Pa or higher after secondary curing. Accordingly, the strength of the bending portion of the display module may be improved, and the durability of the display module may be improved.

The disclosure may provide a method for manufacturing a display module with improved reliability.

A display module of the disclosure may have a bending portion with improved strength and improved durability.

Although the disclosure has been described with reference to embodiments, it will be understood by those skilled in the art that various changes in form and details may be made therein without departing from the spirit and scope of the disclosure as set forth in the following claims.

Accordingly, the technical scope of the disclosure is not intended to be limited to the contents set forth in the detailed description of the specification, but is intended to be defined by the appended claims.

What is claimed is:

1. A display module comprising:
a base layer including a first portion including a light emitting device, a second portion including a circuit board electrically connected to the second portion, and a third portion disposed between the first portion and the second portion, the third portion being bent;
a light emitting device layer overlapping the first portion in a plan view and disposed on an upper surface of the first portion of the base layer;
a protective film disposed on a lower surface of the base layer, the protective film including an opening overlapping the third portion of the base layer in the plan view; and
a first protective layer disposed on a lower surface of the third portion, the first protective layer overlapping the opening of the protective film in the plan view and contacting inner lateral sides of the protective film in the opening,
wherein a modulus of the first protective layer is in a range of about $10^6$ Pa or higher.

2. The display module of claim 1, wherein the first protective layer comprises at least one of an acrylic resin, an epoxy-based resin, and a silicon-based resin.

3. The display module of claim 1, further comprising:
a second protective layer disposed on an upper surface of the third portion of the base layer.

4. A method for manufacturing a display module, the method comprising:
providing a base layer including a first portion, a second portion, and a third portion disposed between the first portion and the second portion, the third portion including flexibility;
providing a light emitting device on an upper surface of the first portion of the base layer;
providing a resin composition on a lower surface of the third portion of the base layer;
curing the resin composition by a first method to form a first cured product;
bending, after curing the resin composition by the first method, the third portion of the base layer such that the first portion of the base layer and the second portion of the base layer face each other; and
curing, after bending the third portion of the base layer, the first cured product by a second method different from the first method to form a second cured product,
wherein the resin composition includes a first reactant activated by the first method and a second reactant activated by the second method.

5. The method of claim 4, wherein a modulus of the first cured product is lower than a modulus of the second cured product.

6. The method of claim 4, wherein a modulus of the resin composition is in a range of about $10^3$ Pa or lower.

7. The method of claim 4, wherein a modulus of the first cured product is in a range of about $10^4$ Pa or lower.

8. The method of claim 4, wherein a modulus of the second cured product is in a range of about $10^6$ Pa or higher.

9. The method of claim 4, further comprising:
providing signal lines to the first portion, the second portion, and the third portion after the providing of the light emitting device and before the providing of the resin composition,
wherein the signal lines overlap at least a portion of the second cured product in a plan view.

10. The method of claim 4, further comprising:
a step of providing a protective film below the base layer before the providing of the resin composition, wherein
the protective film includes an opening overlapping at least a portion of the third cured product in a plan view, and
the providing of the resin composition includes providing the resin composition in the opening of the protective film.

11. The method of claim 4, wherein
the first method is UV curing, and
the second method is thermal curing or natural curing.

12. The method of claim 4, wherein the first reactant comprises a photoinitiator or a latent catalyst.

13. The method of claim 4, wherein the second reactant comprises a thermal initiator, a material containing an isocyanate group, or a silicon-based material.

14. The method of claim 4, wherein
the first reactant comprises an acrylic monomer, an acrylic oligomer, and an acrylic radical photoinitiator, and
the second reactant comprises a urethane-based material containing an isocyanate group.

15. The method of claim 4, wherein
the first reactant comprises an acrylic monomer, an acrylic oligomer, and an acrylic radical photoinitiator, and
the second reactant comprises an epoxy-based monomer, an epoxy-based oligomer, and an epoxy-based anion thermal initiator.

16. The method of claim 4, wherein
the first reactant comprises an acrylic monomer, an acrylic oligomer, and an acrylic radical photoinitiator, and
the second reactant comprises an acrylic monomer, an acrylic oligomer, and an acrylic thermal initiator.

17. The method of claim 4, wherein
the first reactant comprises an epoxy-based monomer, an epoxy-based oligomer, and an epoxy-based cation photoinitiator, and
the second reactant comprises an epoxy-based monomer, an epoxy-based oligomer, and an epoxy-based cation thermal initiator.

18. The method of claim 4, wherein
the first reactant comprises a latent catalyst and an inhibitor, and
the second reactant comprises a silicon-based monomer and a silicon-based oligomer.

19. The method of claim 4, further comprising:
providing a circuit board to the second portion before the providing of the resin composition.

20. An electronic device comprising:
a display module;
a window disposed on the display module; and
a housing disposed under the display module, wherein
the display module comprises:
a base layer including a first portion including a light emitting device, a second portion including a circuit board electrically connected to the second portion, and a third portion disposed between the first portion and the second portion, the third portion being bent;
a light emitting device layer overlapping the first portion in a plan view and disposed on an upper surface of the first portion of the base layer;
a protective film disposed on a lower surface of the base layer, the protective film including an opening overlapping the third portion of the base layer in the plan view; and
a first protective layer disposed on a lower surface of the third portion, the first protective layer overlapping the opening of the protective film in the plan view and contacting inner lateral sides of the protective film in the opening, and
a modulus of the first protective layer is in a range of about $10^6$ Pa or higher.

* * * * *